(12) United States Patent
Ueno et al.

(10) Patent No.: US 11,165,029 B2
(45) Date of Patent: Nov. 2, 2021

(54) AMINE COMPOUND AND ORGANIC ELECTROLUMINESCENCE DEVICE INCLUDING THE SAME

(71) Applicant: SAMSUNG DISPLAY CO., LTD., Yongin-si (KR)

(72) Inventors: Masatsugu Ueno, Yokohama (JP); Akinori Yamatani, Yokohama (JP); Hiroaki Itoi, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 312 days.

(21) Appl. No.: 15/465,845

(22) Filed: Mar. 22, 2017

(65) Prior Publication Data
US 2018/0083209 A1    Mar. 22, 2018

(30) Foreign Application Priority Data
Sep. 22, 2016  (KR) .................. 10-2016-0121652

(51) Int. Cl.
*H01L 51/50* (2006.01)
*H01L 51/00* (2006.01)
*C07F 7/08* (2006.01)

(52) U.S. Cl.
CPC .......... *H01L 51/0094* (2013.01); *C07F 7/081* (2013.01); *H01L 51/006* (2013.01);
(Continued)

(58) Field of Classification Search
None
See application file for complete search history.

(56) References Cited

U.S. PATENT DOCUMENTS 7,846,558 B2   12/2010   Je et al.
7,927,719 B2   4/2011    Hwang et al.
(Continued)

FOREIGN PATENT DOCUMENTS

EP    1 921 082 B1    4/2010
JP    2009-029726 A   2/2009
(Continued)

OTHER PUBLICATIONS

Office Action issued in U.S. Appl. No. 15/830,956 by the USPTO, dated Dec. 27, 2019, 13 pages.

*Primary Examiner* — Gregory D Clark
(74) *Attorney, Agent, or Firm* — Lewis Roca Rothgerber Christie LLP

(57) ABSTRACT

Provided are an amine compound and an organic electroluminescence device including the same. The amine com-
(Continued)

pound according to an embodiment is represented by the following Formula 1,

[Formula 1]

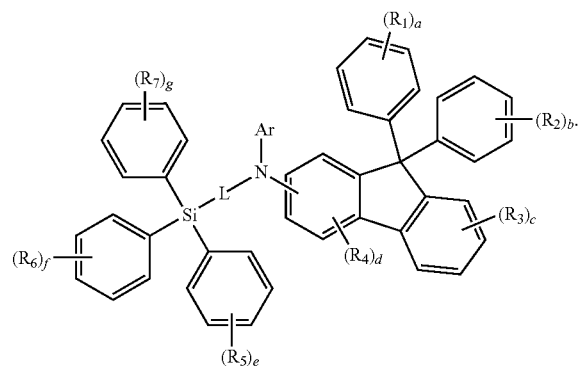

20 Claims, 1 Drawing Sheet

(52) U.S. Cl.
CPC ...... *H01L 51/0052* (2013.01); *H01L 51/0058* (2013.01); *H01L 51/5056* (2013.01)

(56) References Cited

U.S. PATENT DOCUMENTS

| | | |
|---|---|---|
| 2011/0220881 A1 | 9/2011 | Yokoyama et al. |
| 2013/0328027 A1 | 12/2013 | Sotoyama et al. |
| 2014/0209869 A1 | 7/2014 | Jung et al. |
| 2014/0312287 A1 | 10/2014 | Stoessel et al. |
| 2015/0270502 A1* | 9/2015 | Fuchiwaki .............. C07F 7/081 257/40 |
| 2015/0333281 A1 | 11/2015 | Kim et al. |
| 2016/0118595 A1 | 4/2016 | Itoi |

FOREIGN PATENT DOCUMENTS

| | | |
|---|---|---|
| JP | 2009-29726 A | 2/2009 |
| JP | 2009-267255 A | 11/2009 |
| JP | 4538752 B2 | 7/2010 |
| JP | 2012-049518 A | 3/2012 |
| JP | 2015-502960 A | 1/2015 |
| JP | 2015-133362 A | 7/2015 |
| KR | 10-0846590 B1 | 7/2008 |
| KR | 10-2010-0039393 A | 4/2010 |
| KR | 10-2011-0056728 A | 5/2011 |
| KR | 10-2011-0068239 A | 6/2011 |
| KR | 10-2011-0069077 A | 6/2011 |
| KR | 10-2011-0081274 A | 7/2011 |
| KR | 10-2014-0074228 A | 6/2014 |
| KR | 10-2015-0036721 A | 4/2015 |
| KR | 10-2015-0048137 A | 5/2015 |
| KR | 10-2015-0077581 A | 7/2015 |
| KR | 2015077581 * | 7/2015 ............ C09K 11/06 |
| KR | 10-2015-0090021 A | 8/2015 |
| KR | 10-2015-0092696 A | 8/2015 |
| KR | 10-2015-0093995 A | 8/2015 |
| KR | 10-2015-0106501 A | 9/2015 |
| WO | WO 2012/011756 A1 | 1/2012 |
| WO | WO 2014/077558 A1 | 5/2014 |
| WO | WO 2014/088047 A1 | 6/2014 |
| WO | WO 2014/088285 A1 | 6/2014 |

* cited by examiner

AMINE COMPOUND AND ORGANIC ELECTROLUMINESCENCE DEVICE INCLUDING THE SAME

CROSS-REFERENCE TO RELATED APPLICATION

Korean Patent Application No. 10-2016-0121652, filed on Sep. 22, 2016, in the Korean Intellectual Property Office, and entitled: "Amine Compound and Organic Electroluminescence Device Including the Same," is incorporated by reference herein in its entirety.

BACKGROUND

1. Field

Embodiments relate to an amine compound and an organic electroluminescence device including the same.

2. Description of the Related Art

Developments on an organic electroluminescence display as an image display are being actively conducted. An organic electroluminescence display is a self-luminescent display which accomplishes display by recombining holes and electrons injected from a first electrode and a second electrode in an emission layer and emitting light from a luminescent material such as an organic compound included in the emission layer.

SUMMARY

Embodiments are directed to an amine compound represented by the following Formula 1.

[Formula 1]

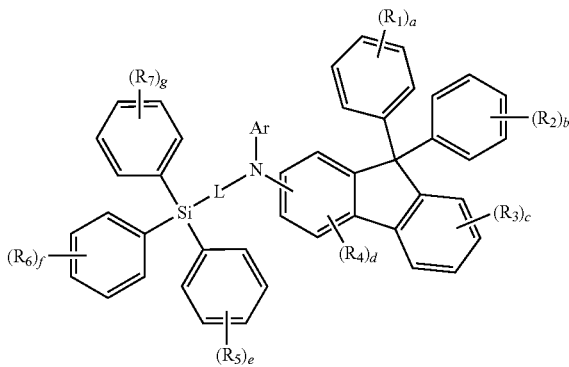

In Formula 1, Ar is a substituted or unsubstituted aryl group having 6 to 30 carbon atoms for forming a ring, L is a substituted or unsubstituted arylene group having 6 to 30 carbon atoms for forming a ring, or a substituted or unsubstituted heteroarylene group having 2 to 30 carbon atoms for forming a ring, $R_1$ to $R_7$ are each independently a hydrogen atom, a deuterium atom, a halogen atom, an amino group, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, where $R_1$ to $R_7$ may be combined with an adjacent group to form a ring, "a," "b," "e," "f," and "g" are each independently an integer of 1 to 5, "c" is an integer of 1 to 4, and "d" is an integer of 1 to 3.

In an embodiment, Ar may be a substituted or unsubstituted monocyclic aryl group.

In an embodiment, Ar may be an unsubstituted phenyl group.

In an embodiment, Formula 1 may be represented by the following Formula 2.

[Formula 2]

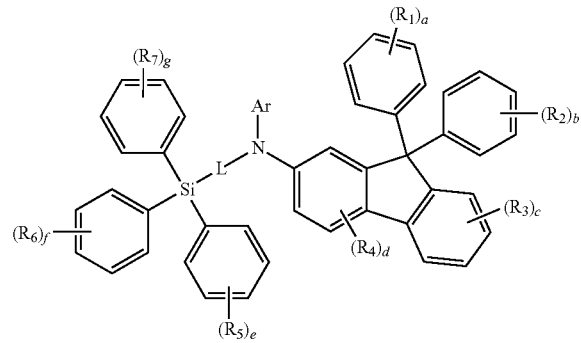

In Formula 2, Ar, L, $R_1$ to $R_7$, and "a" to "g" are the same as described above.

In an embodiment, Formula 1 may be represented by the following Formula 3.

[Formula 3]

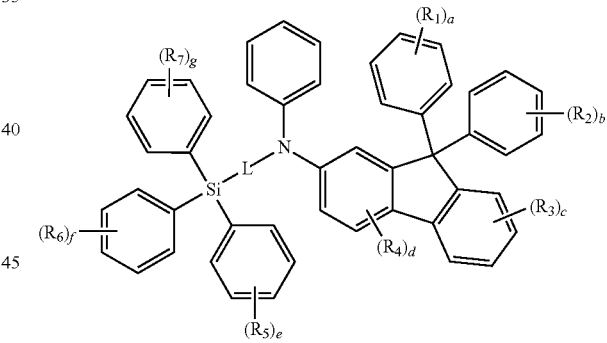

In Formula 3, L, $R_1$ to $R_7$, and "a" to "g" are the same as described above.

In an embodiment, L may be a substituted or unsubstituted arylene group having 6 to 30 carbon atoms for forming a ring.

In an embodiment, L may be a substituted or unsubstituted phenylene group, a substituted or unsubstituted biphenylene (divalent biphenyl) group, or a substituted or unsubstituted fluorenylene group.

In an embodiment, L may be a substituted or unsubstituted polycyclic heteroarylene group.

In an embodiment, L may be a substituted or unsubstituted dibenzofuranylene (divalent dibenzofuranyl) group, or a substituted or unsubstituted dibenzothiophenylene (divalent dibenzothiophenyl) group.

In an embodiment, "a" and "b" may be each independently 2 or more, and at least one of $R_1$ and $R_2$ may be combined with an adjacent $R_1$ or $R_2$ to form a ring.

In an embodiment, Formula 1 may be represented by the following Formula 4.

[Formula 4]

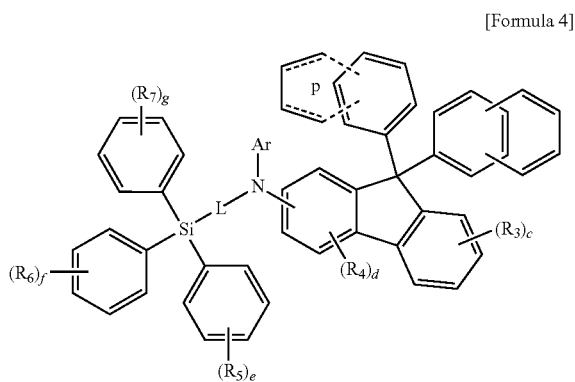

In Formula 4, "p" is 0 or 1, and Ar, L, $R_3$ to $R_7$, and "c" to "g" are the same as described above.

In an embodiment, Formula 1 may be represented by the following Formula 5.

[Formula 5]

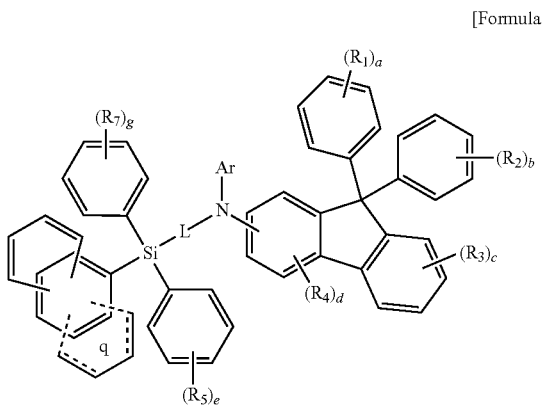

In Formula 5, "q" is 0 or 1, and Ar, L, $R_1$ to $R_5$, $R_7$, "a" to "e", and "g" are the same as described above.

In an embodiment, Ar may be an unsubstituted phenyl group, L may be a substituted or unsubstituted, divalent biphenyl group, and "a" to "g" may be each independently 0.

In an embodiment, "c" may be 1, and $R_3$ may be a substituted or unsubstituted phenyl group.

In an embodiment, Formula 1 may be represented by the following Formula 6.

[Formula 6]

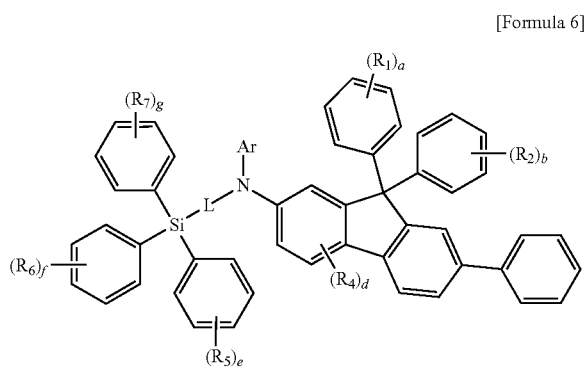

In Formula 6, Ar, L, $R_1$, $R_2$, $R_4$ to $R_7$, "a", "b", and "d" to "g" are the same as described above.

In an embodiment, an organic electroluminescence device includes a first electrode, a hole transport region provided on the first electrode, an emission layer provided on the hole transport region, an electron transport region provided on the emission layer, and a second electrode provided on the electron transport region, wherein the hole transport region includes an amine compound according to an embodiment.

BRIEF DESCRIPTION OF THE DRAWINGS

Features will become apparent to those of skill in the art by describing in detail example embodiments with reference to the attached drawings in which.

DETAILED DESCRIPTION

Figure 1:
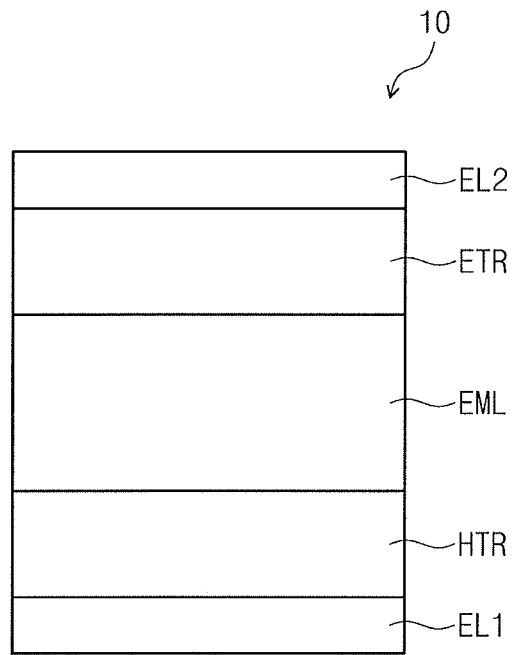
FIG. 1 illustrates a schematic cross-sectional view of an organic electroluminescence device according to an embodiment.

Example embodiments will now be described more fully hereinafter with reference to the accompanying drawings; however, they may be embodied in different forms and should not be construed as limited to the present embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "comprises," "includes," "comprising," or "including," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc. is referred to as being 'on' another part, it can be directly on the other part, or intervening layers may also be present. On the contrary, when a layer, a film, a region, a plate, etc. is referred to as being 'under' another part, it can be directly under the other part, or intervening layers may also be present.

In the present disclosure,

means a position to be connected.

In the present disclosure, "substituted or unsubstituted" may mean substituted with or including at least one substituent selected from the group of deuterium, halogen, cyano, nitro, amino, silyl, boron, phosphine oxide, phosphine sulfide, alkyl, alkenyl, aryl, and heteroaryl or unsubstituted. In addition, each of the substituent illustrated above may be substituted or unsubstituted. For example, biphenyl may be interpreted as aryl, or phenyl substituted with phenyl.

In the present disclosure, the description of forming a ring by combining adjacent groups with each other may mean forming a substituted or unsubstituted hydrocarbon ring, or a substituted or unsubstituted heterocycle by combining adjacent groups with each other. The hydrocarbon ring may include an aliphatic hydrocarbon ring and an aromatic hydrocarbon ring. The heterocycle may include an aliphatic heterocycle and aromatic heterocycle. The hydrocarbon ring and heterocycle may be a monocycle or polycycle. In addition, the ring formed by combining adjacent groups may be connected with another ring to form a spiro structure.

In the present disclosure, the terms "an adjacent group" may mean a substituent at an atom which is directly connected with another atom at which a corresponding substituent is substituted, another substituent at an atom at which a corresponding substituent is substituted, or a substituent stereoscopically disposed at the nearest position to a corresponding substituent. For example, two methyl groups in 1,2-dimethylbenzene may be interpreted as "adjacent groups", and two ethyl groups in 1,1-diethylcyclopentene may be interpreted as "adjacent groups".

In the present disclosure, a halogen atom may include a fluorine atom, a chlorine atom, a bromine atom, or an iodine atom.

In the present disclosure, the alkyl group may have a linear, branched or cyclic shape. The carbon number of the alkyl may be 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present disclosure, the aryl group means an optional functional group or substituent derived from an aromatic hydrocarbon ring. The aryl may be monocyclic aryl or polycyclic aryl. The carbon number of the aryl for forming a ring may be 6 to 30, 6 to 20, or 6 to 15. Examples of the aryl may include phenyl, naphthyl, fluorenyl, anthracenyl, phenanthryl, biphenyl, terphenyl, quaterphenyl, quinqphenyl, sexiphenyl, triphenylene, pyrenyl, benzofluoranthenyl, chrysenyl, etc., without limitation.

In the present disclosure, the fluorenyl may be substituted, or two substituents may be combined with each other to form a spiro structure.

In the present disclosure, the heteroaryl may be heteroaryl including at least one of O, N, P, or S as a heteroatom. For example, the heteroaryl may include at least one of O or S as a heteroatom. The carbon number of the heteroaryl for forming a ring may be 2 to 30, or 2 to 20. The heteroaryl may be monocyclic heteroaryl or polycyclic heteroaryl. The polycyclic heteroaryl may have, for example, a bicyclic or tricyclic structure. Examples of the heteroaryl may include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidinyl, pyrido pyrazinyl, pyrazino pyrazinyl, isoquinoline, indole, carbazole, N-arylcarbazole, N-heteroaryl carbazole, N-alkyl carbazole, benzoxazole, benzoimidazole, benzothiazole, benzocarbazole, benzothiophene, dibenzothiophene, thienothiophene, benzofuranyl, phenanthroline, thiazolyl, isooxazolyl, oxadiazolyl, thiadiazolyl, benzothiazolyl, phenothiazinyl, dibenzofuranyl, etc., without limitation.

In the present disclosure, the explanation on the aryl group may be applied to the arylene group, except that the arylene is divalent.

In the present disclosure, the explanation of the heteroaryl group may be applied to the heteroarylene group except that the heteroarylene is divalent.

In the present disclosure, the silyl may include alkyl silyl and aryl silyl. Examples of the silyl may include trimethylsilyl, triethylsilyl, t-butyl dimethylsilyl, vinyl dimethylsilyl, propyl dimethylsilyl, triphenylsilyl, diphenylsilyl, phenylsilyl, etc., without limitation.

In the present disclosure, the boron may include alkyl boron and aryl boron. Examples of the boron may include trimethyl boron, triethyl boron, t-butyl dimethyl boron, triphenyl boron, diphenyl boron, phenyl boron, etc., without limitation.

In the present disclosure, the alkenyl may be linear or branched. The carbon number may be, for example, 2 to 30, 2 to 20, or 2 to 10. Examples of the alkenyl may include vinyl, 1-butenyl, 1-pentenyl, 1,3-butadienyl aryl, styrenyl, styrylvinyl, etc., without limitation.

In the present disclosure, the carbon number of the amino may be, for example, 1 to 30. The amino may include alkylamino and arylamino. Examples of the amino may include methylamino, dimethylamino, phenylamino, diphenylamino, naphthylamino, 9-methyl-anthracenylamino, triphenylamino, etc., without limitation.

Hereinafter, the amine compound according to an embodiment will be described.

The amine compound according to an embodiment is represented by the following Formula 1.

[Formula 1]

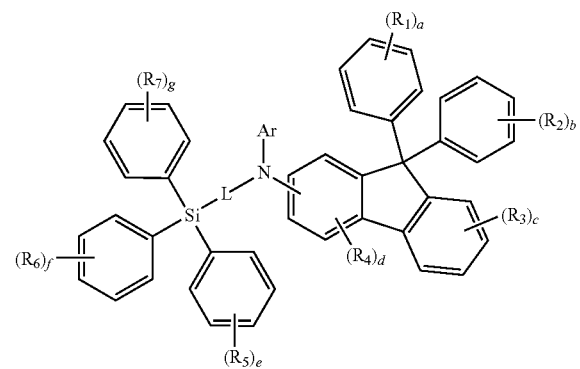

In Formula 1, Ar may be a substituted or unsubstituted aryl group having 6 to 30 carbon atoms for forming a ring, L may be a substituted or unsubstituted arylene group having 6 to 30 carbon atoms for forming a ring, or a substituted or unsubstituted heteroarylene group having 2 to 30 carbon atoms for forming a ring, $R_1$ to $R_7$ may each independently be a hydrogen atom, a deuterium atom, a halogen atom, an amino group, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring. In an implementation, $R_1$ to $R_7$ may be combined with an adjacent group to form a ring. In an implementation, "a" to "c" and "e" to "g" may each independently be an integer of 0 to 4, and "d" may be an integer of 0 to 3. In an implementation, "a," "b," "e," "f," and "g" may each independently be an integer of 1 to 5, "c" may be an integer of 1 to 4, and "d" may be an integer of 1 to 3.

In Formula 1, in the case where "a" is 2 or more, a plurality of $R_1$ may be the same or different. In Formula 1, in the case where "b" is 2 or more, a plurality of $R_2$ may be the same or different. In Formula 1, in the case where "c" is 2 or more, a plurality of $R_3$ may be the same or different. In Formula 1, in the case where "d" is 2 or more, a plurality or $R_4$ may be the same or different. In Formula 1, in the case where "e" is 2 or more, a plurality of $R_5$ may be the same or different. In Formula 1, in the case where "f" is 2 or more, a plurality of $R_6$ may be the same or different. In Formula 1, in the case where "g" is 2 or more, a plurality of $R_7$ may be the same or different. In the case where a plurality of $R_1$ is the same or different, and $R_1$ are three, a case where three $R_1$s are different from each other, a case where three $R_1$s are the same, and a case where two of the three $R_1$s are the same and the remaining one is different, may be possible.

In Formula 1, Ar may be a substituted or unsubstituted monocyclic aryl group. In an example embodiment, in Formula 1, Ar may be an unsubstituted phenyl group.

The fluorenyl moiety in Formula 1 may be combined with a nitrogen atom at position 2. For example, Formula 1 may be represented by the following Formula 2.

[Formula 2]

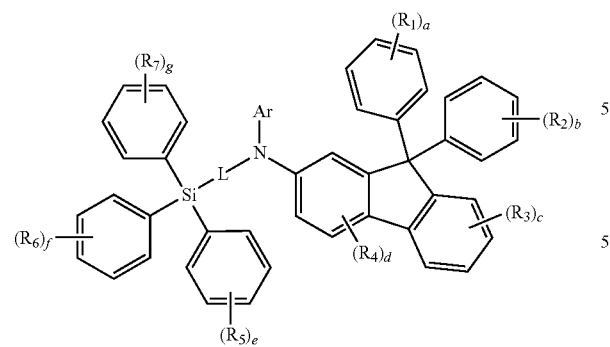

In Formula 2, Ar, L, $R_1$ to $R_7$, and "a" to "g" are the same as defined in Formula 1.

In Formula 2, Ar may be unsubstituted phenyl group, and L may be substituted or unsubstituted arylene having 6 to 30 carbon atoms for forming a ring.

For example, Formula 1 may be represented by the following Formula 3.

[Formula 3]

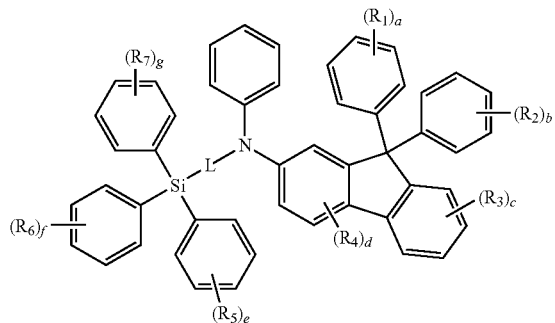

In Formula 3, L, $R_1$ to $R_7$, and "a" to "g" are the same as defined in Formula 1.

In Formula 1, L may be substituted or unsubstituted arylene having 6 to 30 carbon atoms for forming a ring. For example, L may be substituted or unsubstituted phenylene, substituted or unsubstituted, divalent biphenyl, or substituted or unsubstituted fluorenylene.

In Formula 1, L may be substituted or unsubstituted, divalent biphenyl group. In Formula 1, L may be a divalent biphenyl group substituted with alkyl having 1 to 20 carbon atoms or 1 to 10 carbon atoms, or an unsubstituted divalent biphenyl group. In Formula 1, L may be a divalent biphenyl group substituted with at least one methyl. In Formula 1, L may be an unsubstituted divalent biphenyl group.

In Formula 1, L may be a substituted or unsubstituted phenylene group. In an example embodiment, in Formula 1, L may be an unsubstituted phenylene group.

In Formula 1, L may be a substituted or unsubstituted fluorenylene group. In Formula 1, L may be a fluorenyl group substituted with alkyl group having 1 to 20 carbon atoms, or aryl group having 6 to 30 carbon atoms for forming a ring, or an unsubstituted fluorenyl group. In Formula 1, L may be a fluorenylene group substituted with at least one methyl.

In Formula 1, L may be substituted or unsubstituted polycyclic heteroarylene. In Formula 1, L may be substituted or unsubstituted tricyclic heteroarylene. In Formula 1, L may be substituted or unsubstituted, divalent dibenzofuranyl, or substituted or unsubstituted, divalent dibenzothiophenyl. In Formula 1, L may be unsubstituted divalent dibenzofuranyl. In Formula 1, L may be unsubstituted divalent dibenzothiophenyl.

In Formula 1, L may be one selected from the following structures.

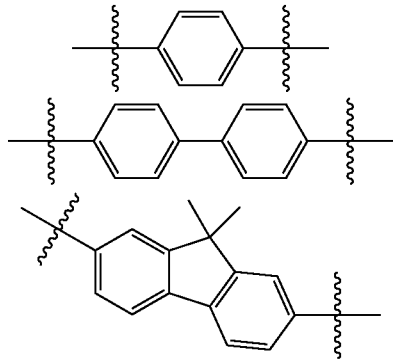

-continued

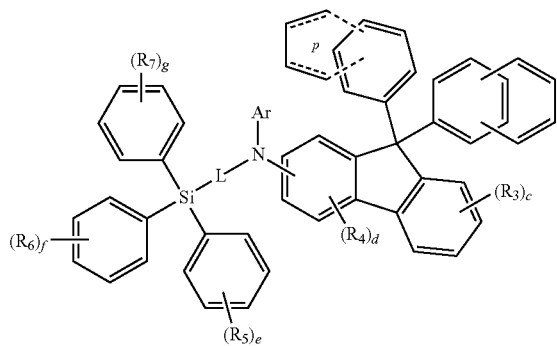

Each of the above structures may be substituted, and the substituent may be, for example, a substituted or unsubstituted alkyl group having 1 to 10 carbon atoms, or substituted or unsubstituted aryl group having 6 to 30 carbon atoms for forming a ring.

In Formula 1, all "a" to "g" may be 0 or $R_1$ to $R_7$ may be hydrogen. For example, in Formula 1, "a" and "b" may be each independently 2 or more, and two or more $R_1$ may be combined with an adjacent group to form a ring, or two or more $R_2$ may be combined with an adjacent group to form a ring. In addition, two or more $R_1$ may be combined with an adjacent group to form a ring, and two or more $R_2$ may be combined with an adjacent group to form a ring at the same time.

For example, two or more $R_1$ may be combined with an adjacent group to form an aliphatic hydrocarbon ring, an aromatic hydrocarbon ring, or an aromatic heterocycle. For example, two or more $R_1$ may be combined with an adjacent group to form an aromatic hydrocarbon ring.

For example, two or more $R_2$ may be combined with an adjacent group to form an aliphatic hydrocarbon ring, an aromatic hydrocarbon ring, or an aromatic heterocycle. For example, two or more $R_2$ may be combined with an adjacent group to form an aromatic hydrocarbon ring.

Formula 1 may be represented by the following Formula 4.

[Formula 4]

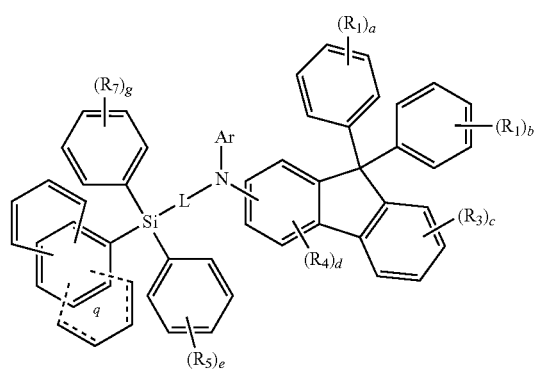

In Formula 4, "p" may be 0 or 1, and Ar, L, $R_3$ to $R_7$, and "c" to "g" are the same as defined in Formula 1. "p" means the number of rings where "p" is written in Formula 4. For example, in the case where "p" is 0, the ring where "p" is written in Formula 4 is not present.

In Formula 4, all "c" to "g" may be 0.

In Formula 4, "p" may be 1, and L may be substituted or unsubstituted, divalent biphenyl group.

In Formula 4, Ar may be unsubstituted phenyl group, and L may be substituted or unsubstituted, divalent biphenyl group.

In Formula 1, all "e" to "g" may be 0. At least one of "e" to "g" may be 1 or 2 or more. In this case, at least one of 1 or more $R_5$, 1 or more $R_6$ and 1 or more $R_7$ may be a halogen atom. For example, at least one of 1 or more $R_5$, 1 or more $R_6$, and 1 or more $R_7$ may be a fluorine atom.

In the case where at least one of "e" to "g" is 2 or more, at least a portion of 2 or more $R_5$, 2 or more $R_6$, and 2 or more $R_7$ may be combined with an adjacent group to from a ring. For example, in the case where "f" is 2 or more, 2 or more $R_6$ may be combined with an adjacent group to form an aliphatic hydrocarbon ring, an aromatic hydrocarbon ring, or an aromatic heterocycle, and may preferably form an aromatic hydrocarbon ring.

Formula 1 may be represented by the following Formula 5.

[Formula 5]

In Formula 5, "q" may be 0 or 1, and Ar, L, $R_1$ to $R_5$, $R_7$, "a" to "e", and "g" are the same as defined in Formula 1. "q" means the number of rings where "q" is written in Formula 5; the "q" ring may be joined to the phenyl ring at various positions. For example, in the case where "q" is 0, a ring where "q" is written in Formula 5 is not present. The opposite fused ring may be joined with the phenyl ring at various positions, as in compounds 5 and 6 herein.

In Formula 5, in the case where "q" is 1, an Si atom of Formula 5 may be substituted with phenanthryl or anthracenyl.

In Formula 5, Ar may be unsubstituted phenyl group, and L may be substituted or unsubstituted phenylene or substituted or unsubstituted, divalent biphenyl group.

In Formula 1, Ar may be unsubstituted phenyl group, L may be substituted or unsubstituted, divalent biphenyl group, and "a" to "g" may be each independently 0.

In Formula 1, "c" may be 1, and $R_3$ may be substituted or unsubstituted phenyl group.

Formula 1 may be represented by, for example, the following Formula 6. The compound represented by Formula 6 is characterized in specifying the substitution position of fluorenyl group, and in the case where the compound is used in an organic electroluminescence device, life increasing effect may be attained.

[Formula 6]

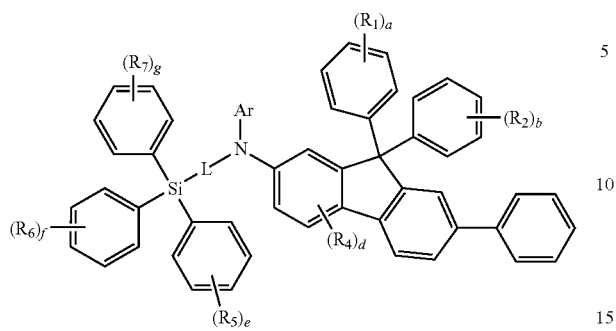

In Formula 6, Ar, L, $R_1$, $R_2$, $R_4$ to $R_7$, "a", "b", and "d" to "g" are the same as defined in Formula 1.

The amine compound represented by Formula 1 may be a monoamine compound.

The amine compound represented by Formula 1 may be used as a material for an organic electroluminescence device. For example, the amine compound represented by Formula 1 may be used as a hole transport material.

The amine compound represented by Formula 1 may be at least one selected from the compounds represented in the following Compound Group 1.

[Compound Group 1]

1

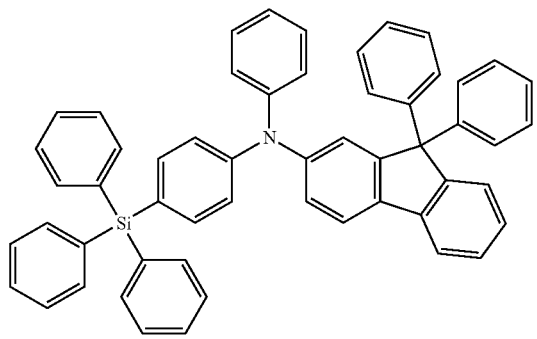

2

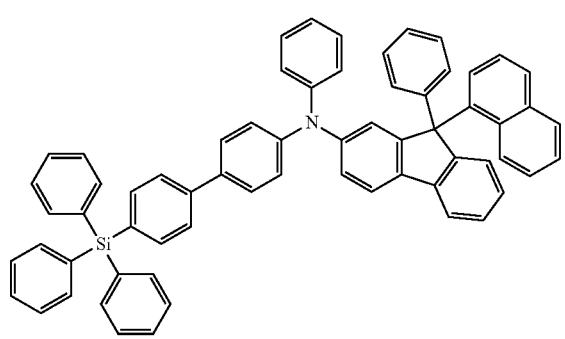

3

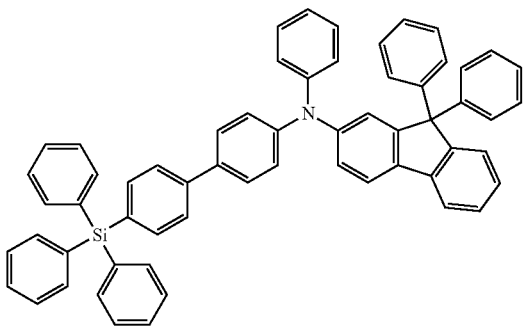

4

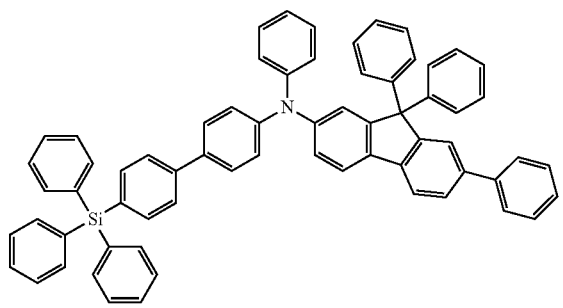

5

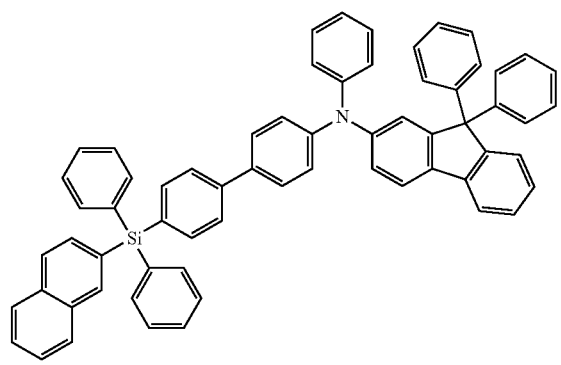

6

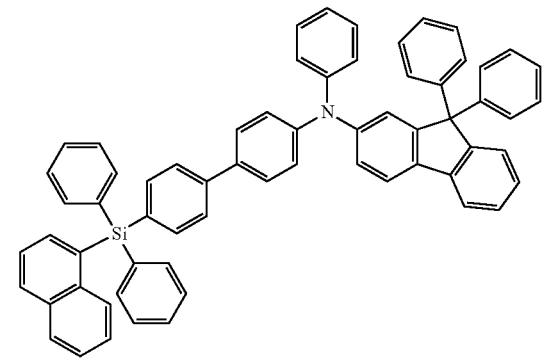

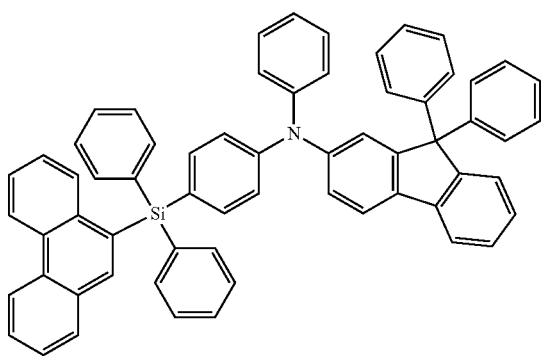

7

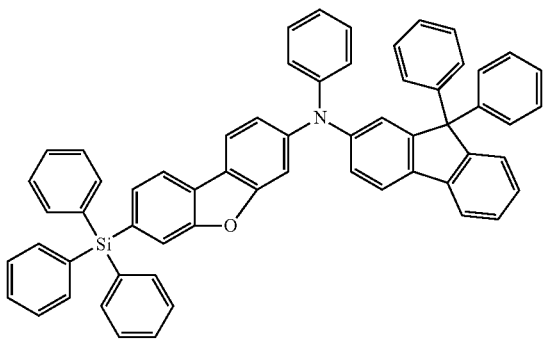

8

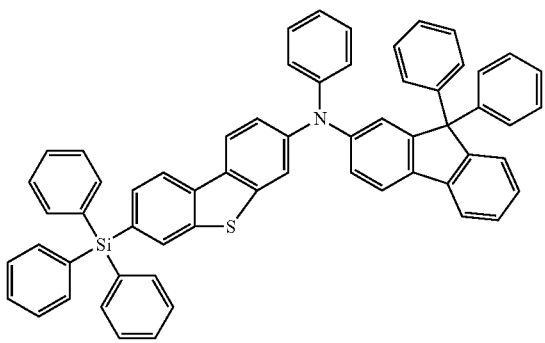

9

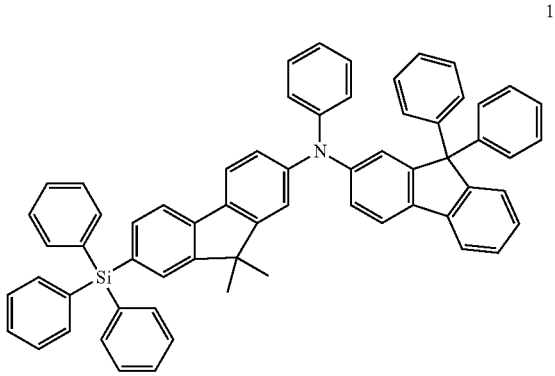

10

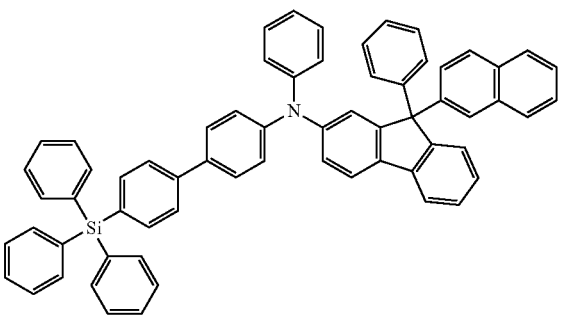

11

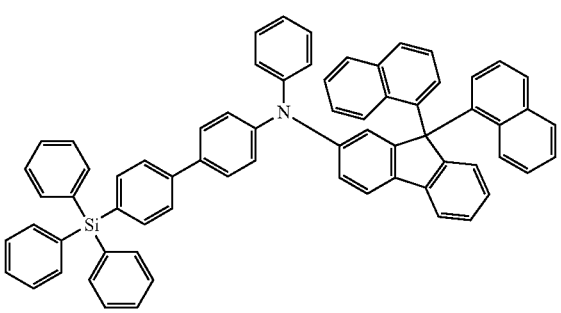

12

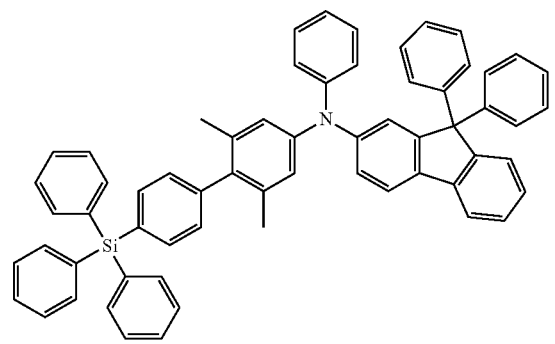

13

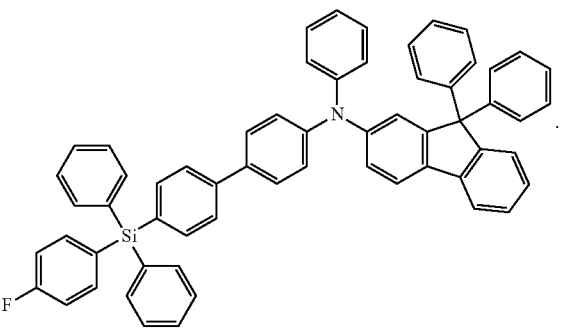

14

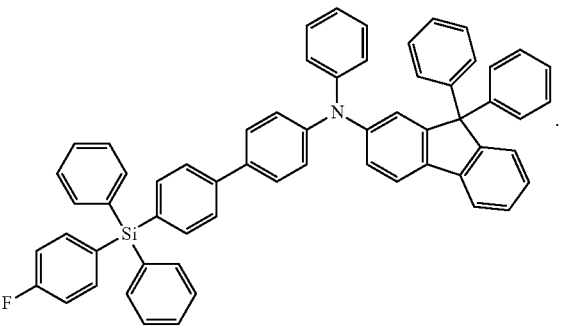

The amine compound according to an embodiment may be, for example, Compound 3.

When the amine compound according to an embodiment may be used in an organic electroluminescence device, high efficiency, long life and/or a low driving voltage may be accomplished.

Hereinafter, an organic electroluminescence device according to an embodiment will be described. The description will be mainly given with difference features of the amine compound according to an embodiment, and unexplained part will follow the above-description on the amine compound according to an embodiment.

An organic electroluminescence device according to an embodiment includes the amine compound according to an embodiment.

Figure 2:
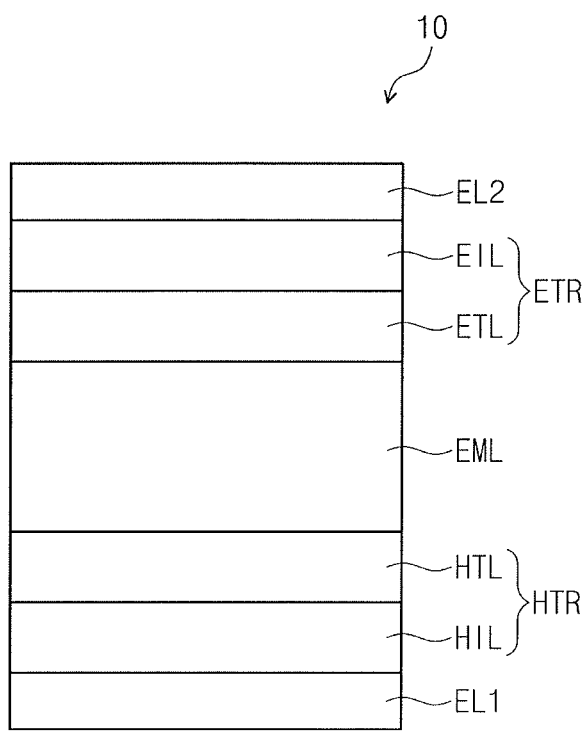
FIG. 2 illustrates a schematic cross-sectional view of an organic electroluminescence device according to an embodiment.

FIG. 1 is a schematic cross-sectional view illustrating an organic electroluminescence device according to an embodiment. FIG. 2 is a schematic cross-sectional view illustrating an organic electroluminescence device according to an embodiment.

Referring to FIGS. 1 and 2, an organic electroluminescence device 10 according to an embodiment may include a first electrode EL1, a hole transport region HTR, an emission layer EML, an electron transport region ETR, and a second electrode EL2.

The first electrode EL1 may have conductivity. The first electrode EL1 may be, for example, a pixel electrode or an anode. The first electrode EL1 may be a transmissive electrode, a transflective electrode, or a reflective electrode. In the case where the first electrode EL1 is the transmissive electrode, the first electrode EL1 may be formed using a transparent metal oxide such as indium tin oxide (ITO), indium zinc oxide (IZO), zinc oxide (ZnO), or indium tin zinc oxide (ITZO). In the case where the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may include a plurality of layers including a reflective layer or transflective layer formed using the above materials, and a transparent layer formed using ITO, IZO, ZnO, or ITZO.

The hole transport region HTR may be provided on the first electrode EL1. The hole transport region HTR may include at least one of a hole injection layer HIL, a hole transport layer HTL, a hole buffer layer, or an electron blocking layer. The thickness of the hole transport region HTR may be, for example, from about 1,000 Å to about 1,500 Å.

Hereinafter, an embodiment of including an amine compound according to an embodiment in a hole transport region HTR will be explained. In various embodiments, an amine compound according to an embodiment may be included in at least one organic layer provided between a first electrode EL1 and a second electrode EL2. For example, the amine compound according to an embodiment may be included in an emission layer EML.

The hole transport region HTR may include an amine compound according to an embodiment. For example, the hole transport region HTR may include an amine compound represented by the following Formula 1.

[Formula 1]

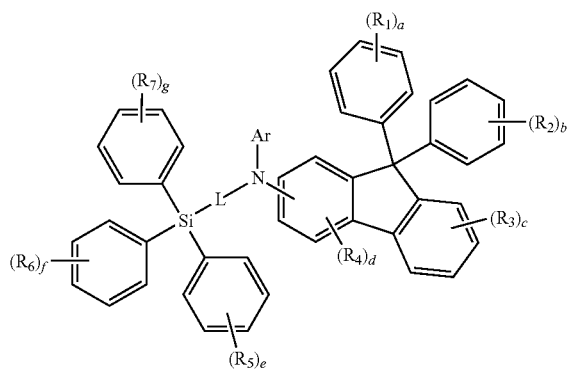

Particular explanation on Ar, L, $R_1$ to $R_7$, and "a" to "g" is the same as described above, and will not be repeated.

The hole transport region HTR may have a single layer formed using a single material, a single layer formed using a plurality of different materials, or a multilayer structure including a plurality of layers formed using a plurality of different materials.

For example, the hole transport region HTR may have a single layer structure of a hole injection layer HIL or a hole transport layer HTL, or may have a single layer structure formed using a hole injection material and a hole transport material. In addition, the hole transport region HTR may have a single layer structure formed using a plurality of different materials, or a laminated structure from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer, without limitation.

In the case where the hole transport region HTR includes the structure of a hole injection layer HIL/hole transport layer HTL, the amine compound according to an embodiment may be included in the hole transport layer HTL. In the case where the hole transport layer HTL includes the amine compound according to an embodiment, the hole transport layer HTL may include one or two or more kinds of the amine compound according to an embodiment.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4', 4"-tris(N,N-diphenylamino)triphenylamine (TDATA), 4,4', 4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f:2',3'-h] quinoxaline-2,3,6,7,10,11-hexacarbonitrile (HAT-CN), etc.

In the case where the hole transport layer HTL includes the amine compound according to an embodiment, materials other than the amine compound according to an embodiment may be further included. For example, carbazole derivatives such as N-phenyl carbazole, and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl) triphenylamine (TCTA), N,N'-di(naphthalene-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), etc. may be further included.

The thickness of the hole transport region HTR may be, for example, from about 100 Å to about 10,000 Å, for example, from about 100 Å to about 1,000 Å. In the case where the hole transport region HTR includes both the hole injection layer HIL and the hole transport layer HTL, the thickness of the hole injection layer HIL may be, for example, from about 100 Å to about 10,000 Å, for example, from about 100 Å to about 1,000 Å, and the thickness of the hole transport layer HTL may be, for example, from about 30 Å to about 1,000 Å. In the case where the thicknesses of the hole transport region HTR, the hole injection layer HIL, and the hole transport layer HTL satisfy the above-described ranges, satisfactory hole transport properties may be obtained without the substantial increase of a driving voltage.

The hole transport region HTR may further include a charge generating material in addition to the above-described materials to improve conductivity. The charge generating material may be dispersed in the hole transport region HTR uniformly or non-uniformly. The charge generating material may be, for example, a p-dopant. The p-dopant may be, for example, one of quinone derivatives, metal oxides, or cyano group-containing compounds, without limitation. For example, non-limiting examples of the p-dopant may include quinone derivatives such as tetracyanoquinodimethane (TCNQ), and 2,3,5,6-tetrafluoro-tetracyanoquinodimethane (F4-TCNQ), metal oxides such as tungsten oxide, and molybdenum oxide, without limitation.

As described above, the hole transport region HTR may further include at least one of the hole buffer layer or the electron blocking layer in addition to the hole injection layer HIL and the hole transport layer HTL. The hole buffer layer may compensate an optical resonance distance according to the wavelength of light emitted from the emission layer EML and increase light emission efficiency. Materials included in the hole transport region HTR may be used as a material included in the hole buffer layer. The electron blocking layer may be a layer preventing electron injection from the electron transport region ETR into the hole transport region HTR.

The emission layer EML may be provided on the hole transport region HTR. The emission layer 150 may be a layer emitting light via fluorescence, or phosphorescence and may be formed to a thickness of, for example, from about 100 Å to about 600 Å.

The emission layer EML may have a single layer formed using a single material, a single layer formed using a plurality of different materials, or a multilayer structure having a plurality of layers formed using a plurality of different materials.

As the material for an emission layer EML, a general luminescent material may be used, for example, fluoranthene derivatives, pyrene derivatives, arylacetylene derivatives, fluorene derivatives, perylene derivatives, chrysene derivatives, etc., may be used, without specific limitation. For example, the pyrene derivatives, the perylene derivatives, the anthracene derivatives may be used. For example, as the host material of the emission layer EML, anthracene derivatives represented by the following Formula 7 may be used.

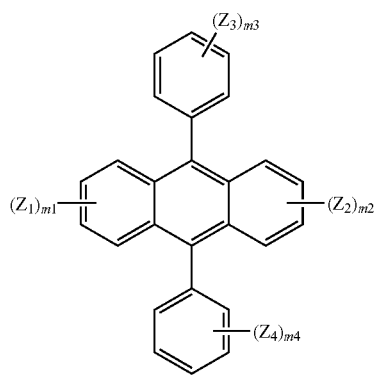

[Formula 7]

In Formula 7, $Z_1$ to $Z_4$ are each independently a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, m1 and m2 are each independently an integer of 0 to 4, and m3 and m4 are each independently an integer of 0 to 5. In Formula 7, $Z_3$ and $Z_4$ may be each independently combined with an adjacent group to form a saturated or unsaturated ring.

The compound represented by Formula 7 may be, for example, a compound represented by the following structure.

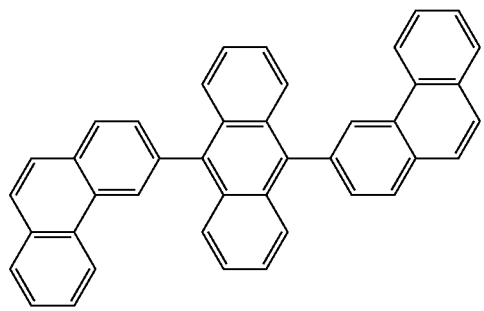

a-1

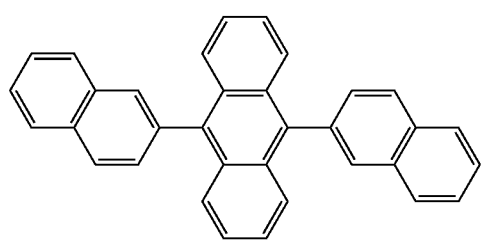

a-2

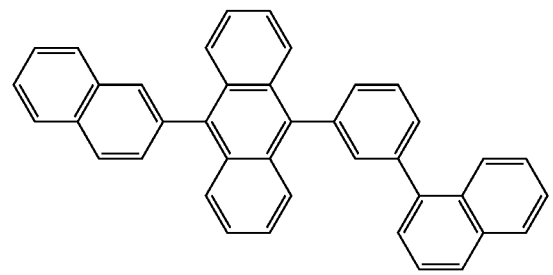

a-3

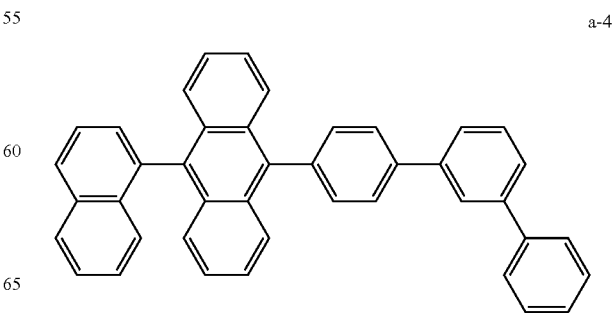

a-4

-continued a-5
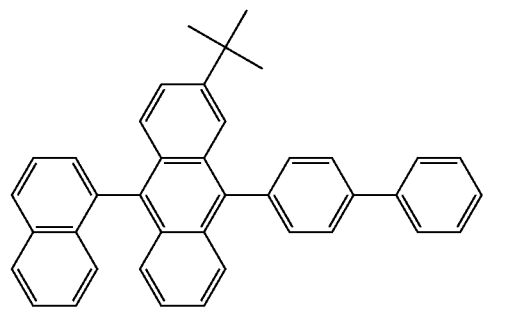

a-6
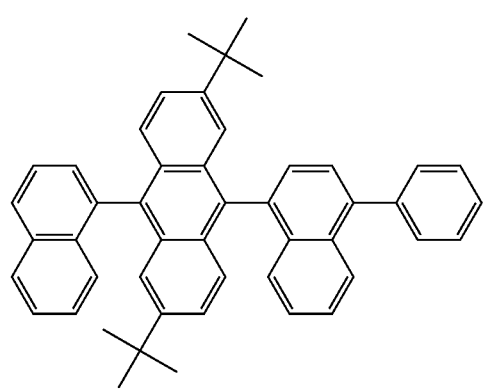

a-7
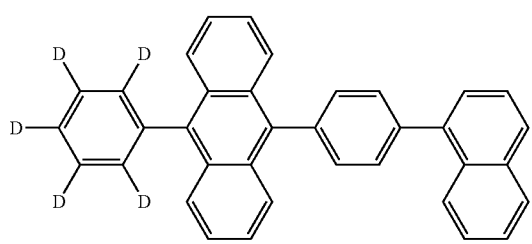

a-8
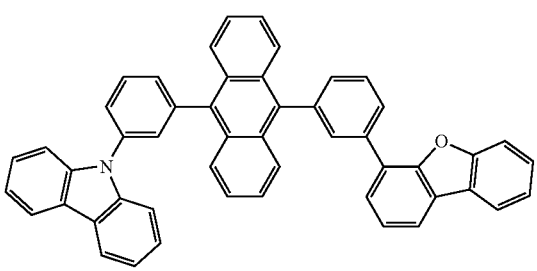

a-9
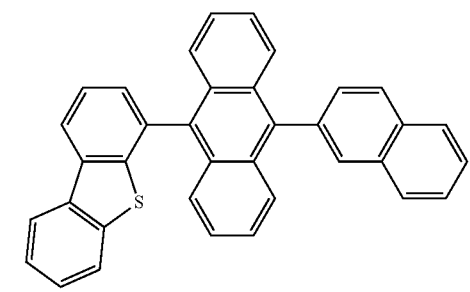

-continued a-10
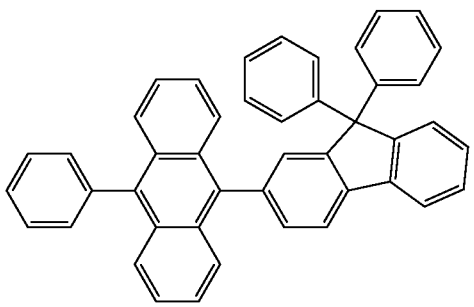

a-11
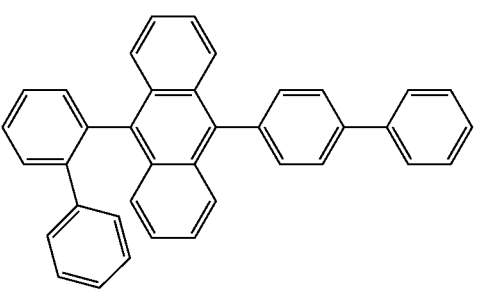

a-12
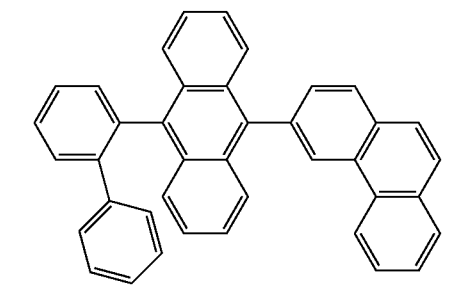

The emission layer EML may include a fluorescent material including one selected from the group of spiro-DPVBi, spiro-6P, 2,2',7,7'-tetrakis(biphenyl-4-yl)-9,9'-spirobifluorene (spiro-sexiphenyl), distyryl-benzene (DSB), distyrylarylene (DSA), a polyfluorene (PFO)-based polymer, and a poly(p-phenylene vinylene)-based polymer (PPV).

The emission layer EML may further include a dopant, and the dopant may use a general material. For example, styryl derivatives such as 1,4-bis[2-(3-N-ethylcarbazoryl)vinyl]benzene (BCzVB), 4-(di-p-tolylamino)-4''-[(di-p-tolylamino)styryl]stilbene (DPAVB), and N-(4-((E)-2-(6-((E)-4-(diphenylamino)styryl)naphthalene-2-yl)vinyl)phenyl)-N-phenylbenzenamine (N-BDAVBi), perylene and derivatives thereof such as 2,5,8,11-tetra-t-butylperylene (TBPe), pyrene and derivatives thereof such as 1,1-dipyrene, 1,4-dipyrenylbenzene, 1,4-bis(N,N-diphenylamino)pyrene), 2,5,8,11-tetra-t-butylperylene (TBP), and 1,3,5-tris(N-phenylbenzimidazole-2-yl)benzene (TPBi) may be used as the dopant.

The emission layer EML may further include, for example, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis (triphenylsilyl)benzene (UGH2), hexaphenylcyclotrisiloxane (DPSiO$_3$), octaphenylcyclotetra siloxane (DPSiO$_4$), 2,8-bis(diphenylphosphoryl)dibenzofuran (PPF), etc.

The electron transport region ETR may be provided on the emission layer EML. The electron transport region ETR may include at least one of, for example, an electron blocking layer, an electron transport layer ETL, or an electron injection layer EIL, without limitation.

The electron transport region ETR may have a single layer formed using a single material, a single layer formed using a plurality of different materials, or a multilayer structure including a plurality of layers formed using a plurality of different materials.

For example, the electron transport region ETR may have a single layer structure of the electron injection layer EIL or the electron transport layer ETL, or a single layer structure formed using an electron injection material and an electron transport material. In addition, the electron transport region ETR may have a single layer structure formed using a plurality of different materials, or a laminated structure from the first electrode EL1 of electron transport layer ETL/electron injection layer EIL, or hole blocking layer/electron transport layer ETL/electron injection layer EIL, without limitation. The thickness of the electron transport region ETR may be, for example, from about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

In the case where the electron transport region ETR includes the electron transport layer ETL, the electron transport region ETR may include tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq$_2$), 9,10-di(naphthalene-2-yl)anthracene (ADN), or a mixture thereof, without limitation. The thickness of the electron transport layer ETL may be from about 100 Å to about 1,000 Å, for example, from about 150 Å to about 500 Å. If the thickness of the electron transport layer ETL satisfies the above-described range, satisfactory electron transport properties may be obtained without the substantial increase of a driving voltage.

In the case where the electron transport region ETR includes the electron injection layer EIL, the electron transport region ETR may include LiF, lithium quinolate (LiQ), Li$_2$O, BaO, NaCl, CsF, a metal in lanthanoides such as Yb, or a metal halide such as RbCl and RbI, without limitation. The electron injection layer EIL also may be formed using a mixture material of an electron transport material and an insulating organo metal salt. The organo metal salt may be, for example, a material having an energy band gap of about 4 eV or more. For example, the organo metal salt may include, for example, metal acetates, metal benzoates, metal acetoacetates, metal acetylacetonates, or metal stearates.

The thickness of the electron injection layer EIL may be, for example, from about 1 Å to about 100 Å, for example, from about 3 Å to about 90 Å. In the case where the thickness of the electron injection layer EIL satisfies the above described range, satisfactory electron injection properties may be obtained without inducing substantial increase of a driving voltage.

The electron transport region ETR may include a hole blocking layer as described above. The hole blocking layer may include, for example, at least one of 2,9-dimethyl-4,7-diphenyl-1,10-phenanthroline (BCP), or 4,7-diphenyl-1,10-phenanthroline (Bphen), without limitation.

The second electrode EL2 may be provided on the electron transport region ETR. The second electrode EL2 may be a common electrode or a cathode. The second electrode EL2 may be, for example, a transmissive electrode, a transflective electrode or a reflective electrode. In the case where the second electrode EL2 is the transmissive electrode, the second electrode EL2 may include transparent metal oxides, for example, ITO, IZO, ZnO, ITZO, etc.

In the case where the second electrode EL2 is the transflective electrode or reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound including thereof, or a mixture thereof (for example, a mixture of Ag and Mg). The second electrode EL2 may have a multilayered structure including a reflective layer or a transflective layer formed using the above-described materials, and a transparent conductive layer formed using ITO, IZO, ZnO, ITZO, etc.

The second electrode EL2 may be connected with an auxiliary electrode. The auxiliary electrode may be connected with the second electrode EL2 to decrease the resistance of the second electrode EL2.

In the organic electroluminescence device 10, a voltage is applied to each of the first electrode EL1 and the second electrode EL2, and holes injected from the first electrode EL1 move via the hole transport region HTR to the emission layer EML, and electrons injected from the second electrode EL2 move via the electron transport region ETR to the emission layer EML. The electrons and holes are recombined in the emission layer EML to generate excitons, which may emit light via transition from an excited state to a ground state.

In the case where the organic electroluminescence device 10 is a top emission type, the first electrode EL1 may be a reflective electrode, and the second electrode EL2 may be a transmissive electrode or a transflective electrode. In the case where the organic electroluminescence device 10 is a bottom emission type, the first electrode EL1 may be a transmissive electrode or a transflective electrode, and the second electrode EL2 may be a reflective electrode.

The organic electroluminescence device according to an embodiment includes an amine compound represented by Formula 1 in a hole transport region, and may provide high efficiency, long life and/or a low driving voltage.

The following Examples and Comparative Examples are provided in order to highlight characteristics of one or more embodiments, but it will be understood that the Examples and Comparative Examples are not to be construed as limiting the scope of the present embodiments, nor are the Comparative Examples to be construed as being outside the scope of the present embodiments. Further, it will be understood that the present embodiments are not limited to the particular details described in the Examples and Comparative Examples

Synthetic Examples

An amine compound according to an embodiment may be synthesized, for example, as follows.

1. Synthesis of Compound 1

Compound 1, which is an amine compound according to an embodiment, may be synthesized by the following reaction.

(Synthesis of Compound B)

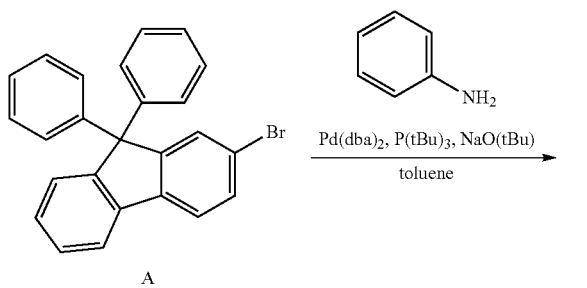

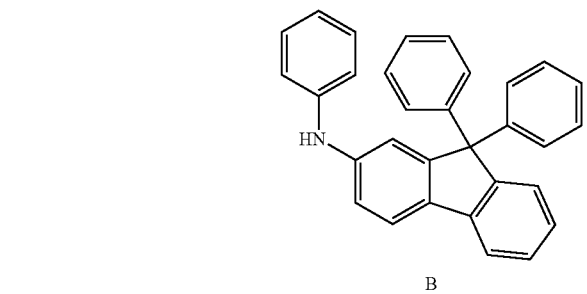

Under an argon (Ar) atmosphere, 3.0 g of Compound A, 0.70 g of aniline, 0.22 g of Pd(dba)₂, 0.73 g of NaOt-Bu, and 0.31 g of t-Bu₃P were added to a 200 mL, three necked flask, followed by heating and refluxing in 75 mL of a toluene solvent for about 3 hours. After air cooling, water was added, an organic layer was separated, and solvents were distilled. The crude product thus obtained was separated by silica gel column chromatography (using hexane and toluene) to obtain 2.78 g (yield 90%) of Compound B as a white solid.

The molecular weight of Compound B measured by FAB-MS was 409.

(Synthesis of Compound 1)

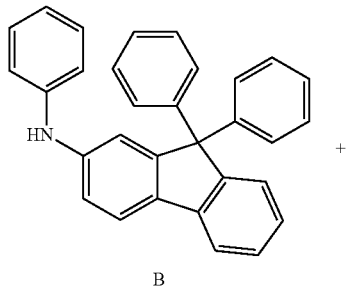

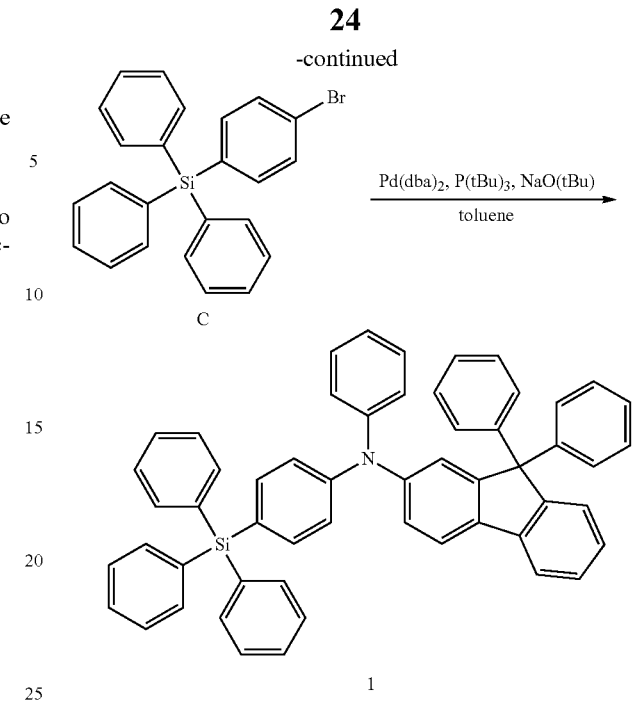

Under an argon (Ar) atmosphere, 2.50 g of Compound B, 2.26 g of Compound C, 0.18 g of Pd(dba)₂, 0.59 g of NaOt-Bu, and 0.25 g of t-Bu₃P were added to a 100 mL, three necked flask, followed by heating and refluxing in 65 mL of a toluene solvent for about 4 hours. After air cooling, water was added, an organic layer was separated, and solvents were distilled. The crude product thus obtained was separated by silica gel column chromatography (using hexane and toluene) to obtain 4.31 g (yield 95%) of Compound 1 as a white solid.

The molecular weight of the white solid compound, measured by FAB-MS was 743. Through the results, the white solid compound was identified as Compound 1.

2. Synthesis of Compound 3

Compound 3 was synthesized according to the same method of synthesizing Compound 1 except for using 4-(4-bromophenyl)tetraphenylsilane instead of Compound C in the synthetic method of Compound 1. The molecular weight of Compound 3 measured by FAB-MS was 819.

3. Synthesis of Compound 4

(Synthesis of Compound E)

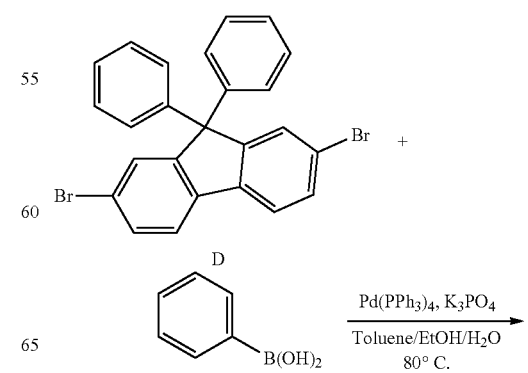

-continued

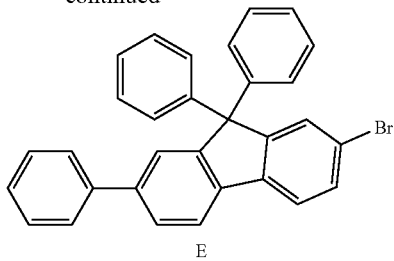

15.0 g of Compound D, 4.60 g of phenylboronic acid, 126 ml of toluene, 63 mL of ethanol, and 32 ml of a 2 M aqueous tripotassium phosphate solution were added to a vessel, followed by filling the remaining space of the vessel with argon. Then, 2.18 g of Pd(PPh$_3$)$_4$ was added thereto, followed by refluxing for about 2 hours. After air cooling, water was added, an organic layer was separated, and solvents were distilled. The crude product thus obtained was separated using silica gel column chromatography (using hexane and toluene) to obtain 9.25 g (yield 62%) of Compound E as a white solid compound.

The molecular weight of Compound E measured by FAB-MS was 472.

(Synthesis of Compound F)

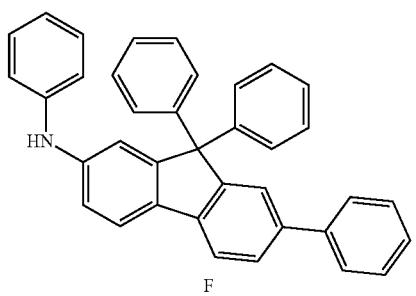

Compound F was synthesized according to the same method of synthesizing Compound B except for using Compound E instead of Compound A in the synthetic method of Compound B. The molecular weight of Compound F measured by FAB-MS was 485.

(Synthesis of Compound 4)

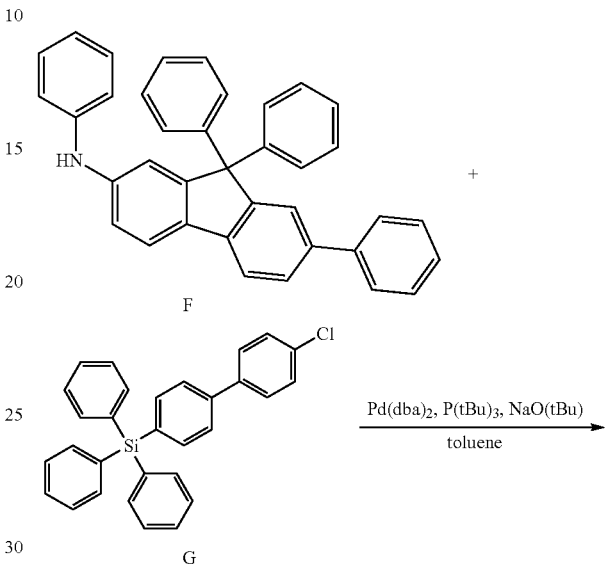

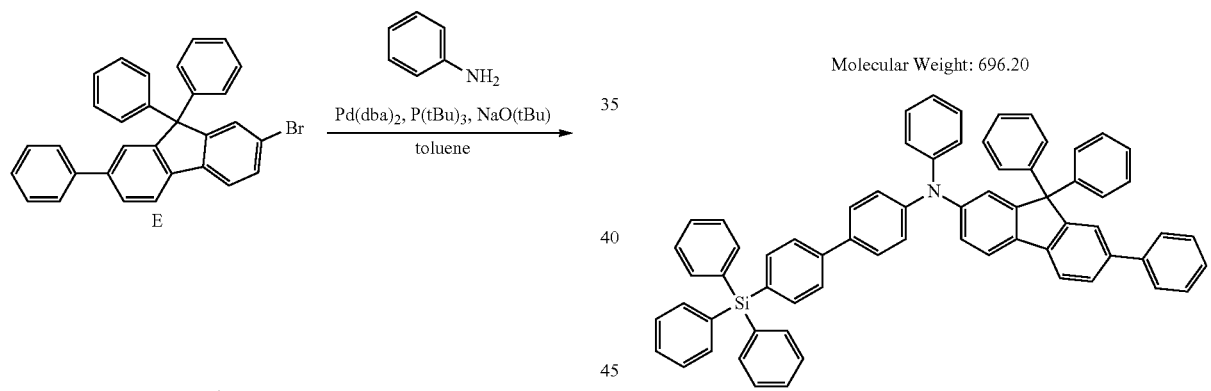

Compound 4 was synthesized according to the same method of synthesizing Compound 1 except for using Compounds F and G instead of Compounds B and C in the synthetic method of Compound 1. The molecular weight of Compound 4 measured by FAB-MS was 895.

4. Synthesis of Compound 6

(Synthesis of Compound H)

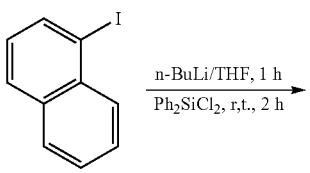

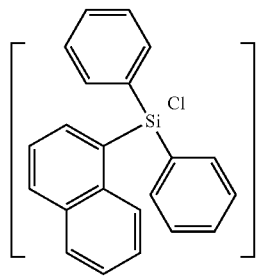 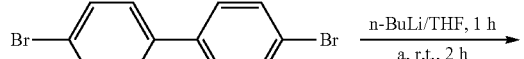

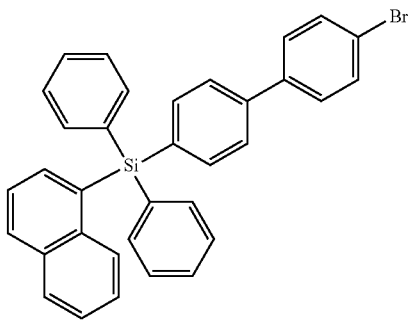

H 20.0 g of 1-iodonaphthalene, and 240 ml of dehydrated THF were added to a reaction vessel filled with argon, followed by cooling to about −78° C. Then, 108.24 ml of n-butyl lithium, 1.6 M in hexane was added thereto dropwise. After finishing dropping, stirring was continued for about 1 hour. Then, 37.75 mL of dichlorodiphenylsilane was added thereto dropwise. After finishing dropping, the solution temperature was gradually elevated back to room temperature, and stirring was continued for about 2 hours. The solution thus obtained was referred to as solution "h".

To a separate reaction vessel, 24.56 g of 4,4'-dibromobiphenyl, 240 mL of dehydrated THF were added, followed by cooling to −78° C. Then, 49.20 mL of n-butyl lithium, 1.6 M in hexane was added dropwise. After finishing dropping, stirring was continued for about 1 hour. The solution "h" was added thereto dropwise, and the solution temperature was elevated back to room temperature, followed by stirring for about 2 hours. Water was added for quenching, and extraction was performed with ethyl acetate. An organic layer was separated, and solvents were distilled. The crude product thus obtained was separated using silica gel column chromatography (using hexane and toluene) to obtain 17.05 g (yield 40%) of Compound H as a white solid compound.

The molecular weight of Compound E measured by FAB-MS was 540.

(Synthesis of Compound 6)

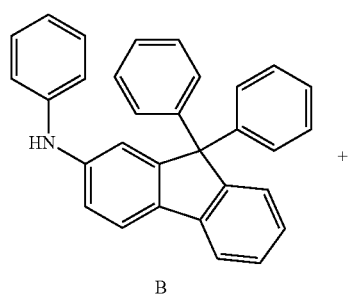

B

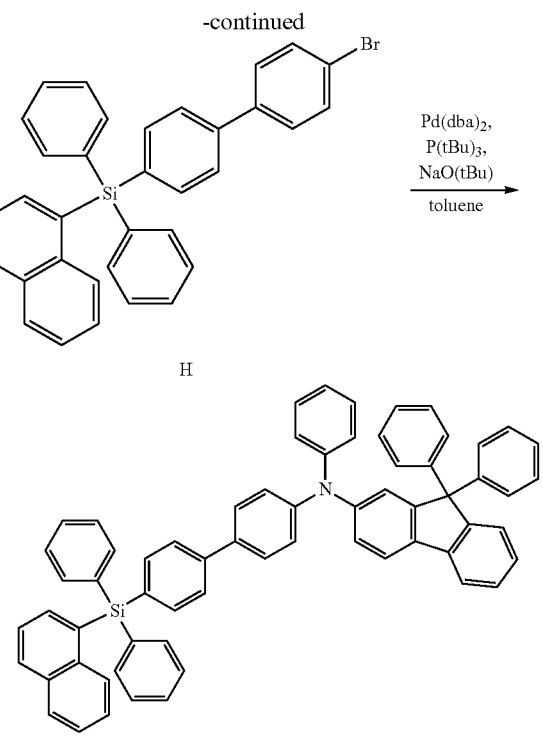

6

Compound 6 was synthesized according to the same method for synthesizing Compound 1 except for using Compound H instead of Compound C in the synthetic method of Compound 1. The molecular weight of Compound 6 measured by FAB-MS was 869.

The measuring of the molecular weight by FAB-MS was conducted using JMS-700V manufactured by JEOL CO.

Device Manufacturing Examples

Organic electroluminescence devices according to Examples 1 to 4 were manufactured using Compounds 1, 3, 4, and 6 as hole transport materials.

Example Compounds

1

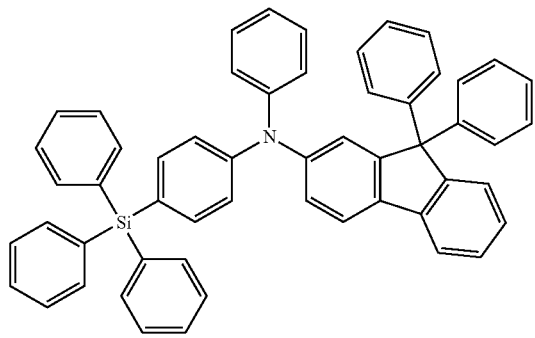

3

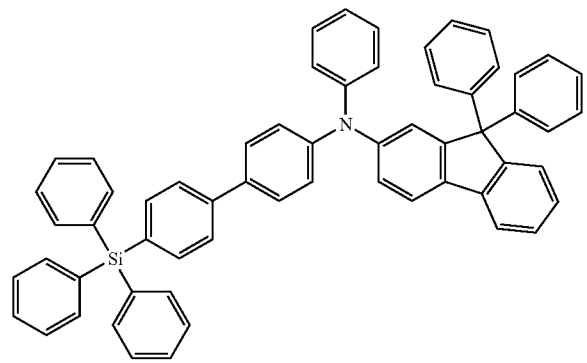

4

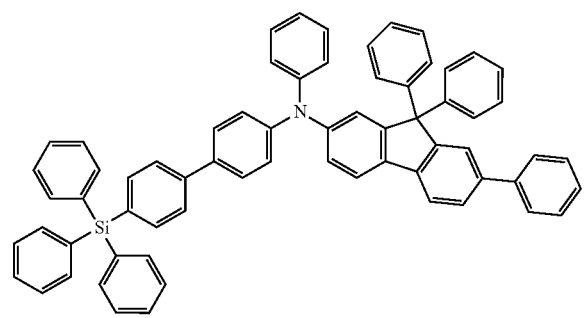

6

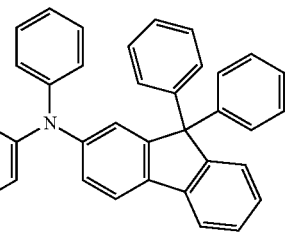

Organic electroluminescence devices according to Comparative Examples 1 to 8 were manufactured using Comparative Compounds X-1 to X-8, below, as hole transport materials.

[Comparative Compounds]

X-1

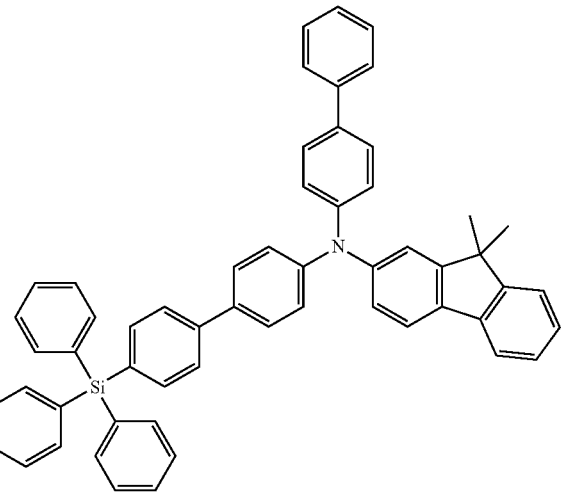

X-2

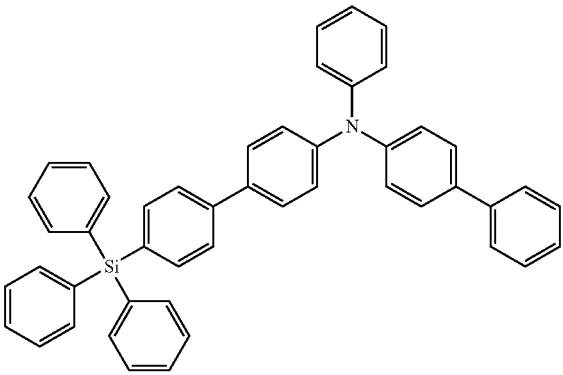

X-3

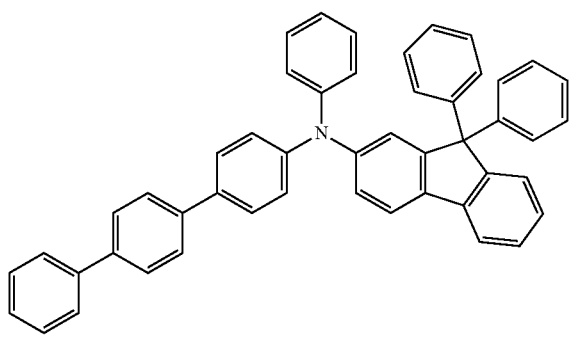

X-4

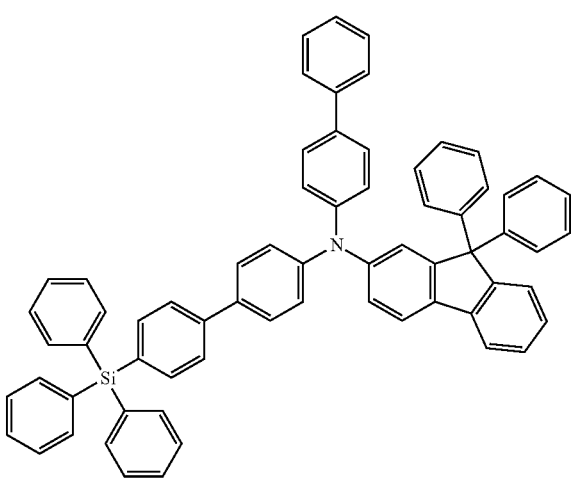

X-5

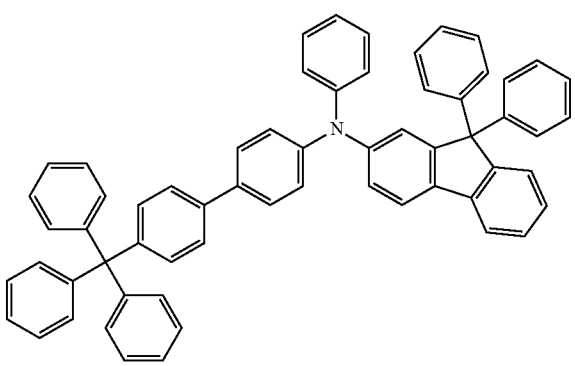

X-6

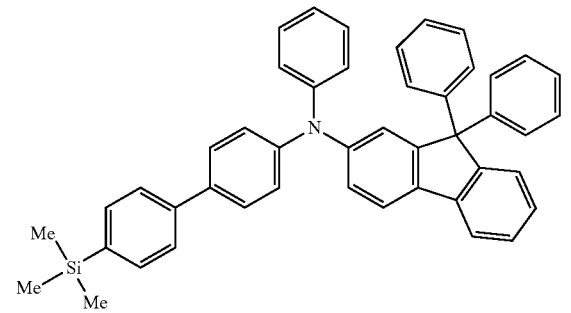

X-7

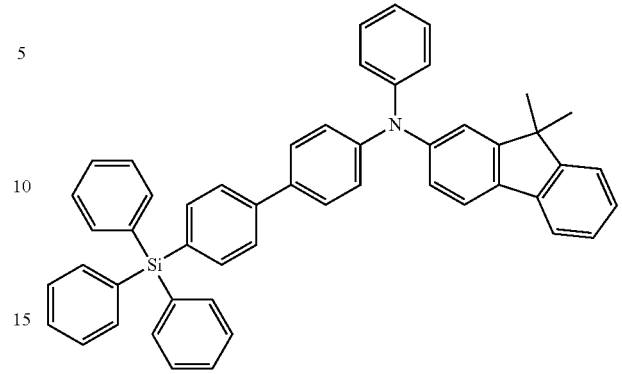

X-8

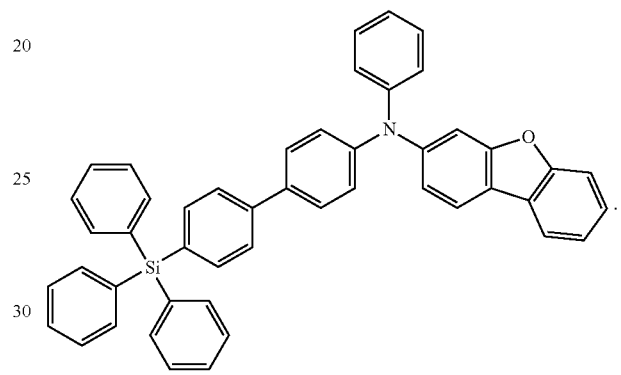

Organic electroluminescence devices according to Examples 1 to 4 and Comparative Examples 1 to 8 were manufactured by forming a first electrode using ITO to a thickness of about 150 nm, a hole injection layer using 2-TNATA to a thickness of about 60 nm, a hole transport layer using the compound according to the example or the comparative example to a thickness of about 30 nm, an emission layer using 9,10-di(naphthalene-2-yl)anthracene (ADN) doped with 3% 2,5,8,11-tetra-t-butylperylene (TBP) to a thickness of about 25 nm, an electron transport layer using Alq$_3$ to a thickness of about 25 nm, an electron injection layer using LiF to a thickness of about 1 nm, and a second electrode using Al to a thickness of about 100 nm. Each layer was formed by a vacuum deposition method.

Then, the voltage, emission efficiency and half life of the organic electroluminescence devices thus manufactured were measured. Evaluation results are listed in Table 1 below. The evaluation of the emission properties of the organic electroluminescence devices was conducted using a C9920-11 brightness light distribution characteristics measurement system manufactured by HAMAMATSU Photonics Co.

TABLE 1

| Device manufacturing example | Hole transport layer material | Current density (mA/cm$^2$) | Voltage (V) | Emission efficiency (cd/A) | Half Life LT50 (h) |
| --- | --- | --- | --- | --- | --- |
| Example 1 | Example Compound 1 | 10 | 6.5 | 7.5 | 2180 |
| Example 2 | Example Compound 3 | 10 | 6.4 | 7.8 | 2350 |

TABLE 1-continued

| Device manufacturing example | Hole transport layer material | Current density (mA/cm$^2$) | Voltage (V) | Emission efficiency (cd/A) | Half Life LT50 (h) |
|---|---|---|---|---|---|
| Example 3 | Example Compound 4 | 10 | 6.6 | 7.6 | 2250 |
| Example 4 | Example Compound 6 | 10 | 6.4 | 7.8 | 2000 |
| Comparative Example 1 | Comparative Compound X-1 | 10 | 7.1 | 6.4 | 1700 |
| Comparative Example 2 | Comparative Compound X-2 | 10 | 7.5 | 6.1 | 1500 |
| Comparative Example 3 | Comparative Compound X-3 | 10 | 7.5 | 6.3 | 1400 |
| Comparative Example 4 | Comparative Compound X-4 | 10 | 7.3 | 6.7 | 1900 |
| Comparative Example 5 | Comparative Compound X-5 | 10 | 7.1 | 6.6 | 500 |
| Comparative Example 6 | Comparative Compound X-6 | 10 | 7.1 | 6.3 | 800 |
| Comparative Example 7 | Comparative Compound X-7 | 10 | 6.8 | 6.9 | 1200 |
| Comparative Example 8 | Comparative Compound X-8 | 10 | 7.2 | 6.7 | 1500 |

Half life LT50 means time taken for reducing initial luminance of 1,000 cd/m$^2$ in half.

Referring to Table 1, a low driving voltage, long life, and high efficiency were exhibited by Examples 1 to 4.

The compounds according to example embodiments of the present disclosure are amine compounds including a fluorenyl group and a triphenylsilyl group, and may provide devices with a low driving voltage, long life, and high efficiency.

An amine compound may be used as a hole transport material. Without being bound by theory, it is believed that an amine compound according to an embodiment may improve hole transport ability by introducing a fluorenyl group having high rigidity and improving stacking degree between molecules, which may help provide an organic electroluminescence device with a low driving voltage and high efficiency. In addition, the amine compound according to an embodiment introduces a triphenylsilyl group; without being bound by theory, it is believed that this may improve charge tolerance and extend device life.

Comparative Compound 1 includes a dimethyl fluorenyl group; without being bound by theory, it is believed that the compound provides a device having high efficiency but has decreased stacking degree between molecules when compared to the amine compound according to an embodiment, which may decrease device life.

Comparative Example 2 does not include a fluorenyl group; without being bound by theory, it is believed that hole transport ability and charge tolerance may be low. Comparative Example 2 had lower efficiency and shorter device life.

Comparative Example 3 does not include a triphenylsilyl group; without being bound by theory, it is believed that charge tolerance may be low. Comparative Example 3 had shorter device life.

The amine compound according to an example embodiment is Formula 1 where Ar is an unsubstituted phenyl group. By comparison, in Comparative Example 4, Ar includes a biphenyl group; without being bound by theory, it is believed that the compound has increased conjugation length (conjugation area). Comparative Example 4 exhibited lower efficiency.

Comparative Example 5 includes quaternary carbon instead of a triphenylsilyl group; without being bound by theory, it is believed that the quaternary carbon has very low charge tolerance and device life is rapidly reduced.

Comparative Example 6 includes a trimethylsilyl group instead of a triphenylsilyl group; without being bound by theory, it is believed that the compound has low charge tolerance and low stacking degree between molecules when compared to a triphenylsilyl group, which may lower efficiency and shorten device life.

Without being bound by theory, it is believed that Comparative Example 7 has decreased stacking degree even further when compared to Comparative Example 1, which may shorten device life.

Comparative Example 8 includes a dibenzofuranyl group instead of a fluorenyl group; without being bound by theory, it is believed that the compound has a lower HOMO energy level than the fluorenyl group, which may lower affect driving voltage and shorten device life.

From the results of Table 1, it can be found that an organic electroluminescence device including an amine compound according to an embodiment may attain a low driving voltage, long life, and increased efficiency at the same time.

By way of summation and review, as an organic electroluminescence device, for example, an organic device composed of a first electrode, a hole transport layer disposed on the first electrode, an emission layer disposed on the hole transport layer, an electron transport layer disposed on the emission layer, and a second electrode disposed on the electron transport layer may be formed. Holes are injected from the first electrode, and the injected holes move via the hole transport layer and injected into the emission layer. Meanwhile, electrons are injected from the second electrode, and the injected electrons move via the electron transport layer and injected into the emission layer. By recombining the injected holes and electrons into the emission layer, excitons are generated in the emission layer. An organic electroluminescence device emits light using light emitted during the transition of the excitons back to a ground state. The configuration of an organic electroluminescence device may be varied.

As described above, embodiments may provide an amine compound which is capable of being used as a material for a hole transport material, and an organic electroluminescence device including the same in a hole transport region.

As described above, An organic electroluminescence device including an amine compound according to an embodiment may attain high efficiency, may have a decreased driving voltage, and may attain long life.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An amine compound represented by Formula 1:

[Formula 1]

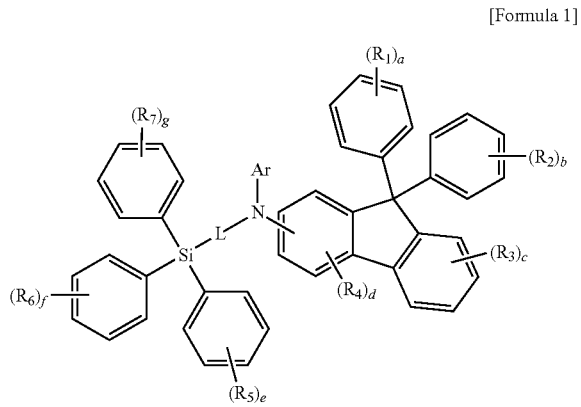

wherein in Formula 1, Ar is a substituted or unsubstituted aryl group having 6 to 30 carbon atoms for forming a ring, wherein when Ar is an aryl group having 6 carbon atoms for forming the ring substituted with a N-containing heteroaryl group, the heteroaryl group is a monocyclic, a bicyclic or a tricyclic heteroaryl group L is a substituted or unsubstituted arylene group having 6 to 30 carbon atoms for forming a ring, or a substituted or unsubstituted heteroarylene group having 2 to 30 carbon atoms for forming a ring, $R_1$ to $R_7$ are each independently a hydrogen atom, a deuterium atom, a halogen atom, an amino group, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, where $R_1$ to $R_7$ are separate or are combined with an adjacent group to form a ring, provided that at least one selected from the group consisting of $R_1$ and $R_2$ is combined with an adjacent $R_1$ or $R_2$ to form a ring, "a," "b," "e," "f," and "g" are each independently an integer of 1 to 5, "c" is an integer of 1 to 4, and "d" is an integer of 1 to 3.

2. The amine compound as claimed in claim 1, wherein Ar is a substituted or unsubstituted monocyclic aryl group.

3. The amine compound as claimed in claim 1, wherein Ar is an unsubstituted phenyl group.

4. The amine compound as claimed in claim 1, wherein Formula 1 is represented by the following Formula 2:

[Formula 2]

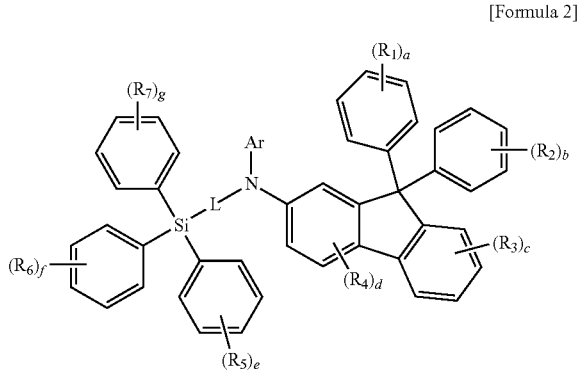

wherein in Formula 2, Ar, L, $R_1$ to $R_7$, and "a" to "g" are the same as for Formula 1.

5. The amine compound as claimed in claim 1, wherein Formula 1 is represented by the following Formula 3:

[Formula 3]

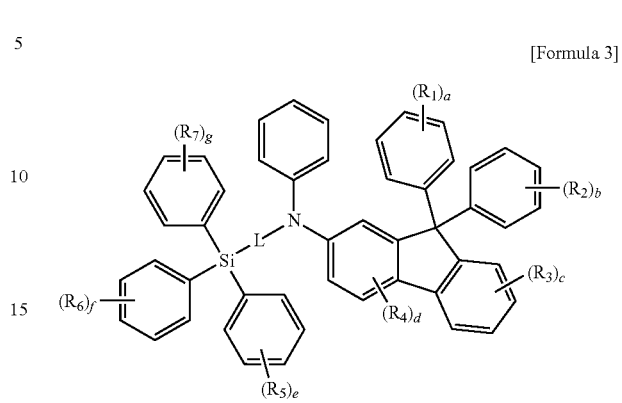

wherein in Formula 3, L, $R_1$ to $R_7$, and "a" to "g" are the same as for Formula claim 1.

6. The amine compound as claimed in claim 1, wherein L is a substituted or unsubstituted arylene group having 6 to 30 carbon atoms for forming a ring.

7. The amine compound as claimed in claim 1, wherein L is a substituted or unsubstituted phenylene group, a substituted or unsubstituted biphenylene group, or a substituted or unsubstituted fluorenylene group.

8. The amine compound as claimed in claim 1, wherein L is a substituted or unsubstituted polycyclic heteroarylene group.

9. The amine compound as claimed in claim 1, wherein L is a substituted or unsubstituted dibenzofuranylene group, or a substituted or unsubstituted dibenzothiophenylene group.

10. The amine compound as claimed in claim 1, wherein:

"a" and "b" are each independently an integer of 2 to 5.

11. The amine compound as claimed in claim 1, wherein the amine compound represented by Formula 1 is represented by the following Formula 4:

[Formula 4]

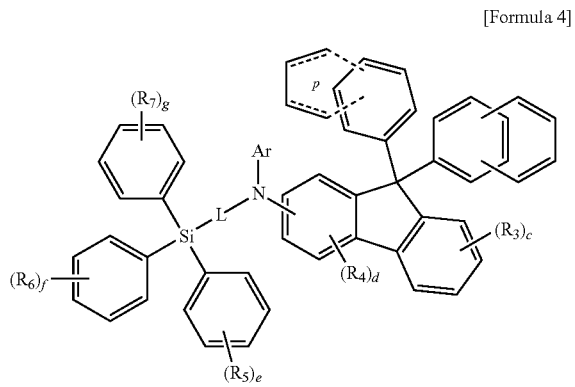

wherein in Formula 4, "p" is 0 or 1, and

Ar, L, $R_3$ to $R_7$, and "c" to "g" are the same as for Formula 1.

12. An amine compound represented by Formula 1:

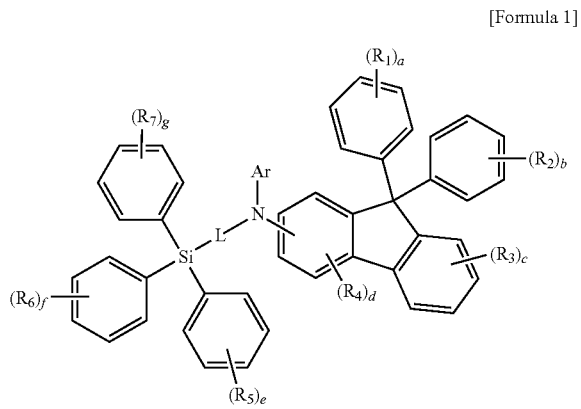

[Formula 1]

wherein in Formula 1, Ar is a substituted or unsubstituted aryl group having 6 to 30 carbon atoms for forming a ring, L is a substituted or unsubstituted arylene group having 6 to 30 carbon atoms for forming a ring, or a substituted or unsubstituted heteroarylene group having 2 to 30 carbon atoms for forming a ring, R1 to R7 are each independently a hydrogen atom, a deuterium atom, a halogen atom, an amino group, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, where $R_1$ to R7 are separate or are combined with an adjacent group to form a ring, "a," "b," "e," "f," and "g" are each independently an integer of 1 to 5, "c" is an integer of 1 to 4, and "d" is an integer of 1 to 3, wherein the amine compound represented by Formula 1 is represented by the following Formula 5:

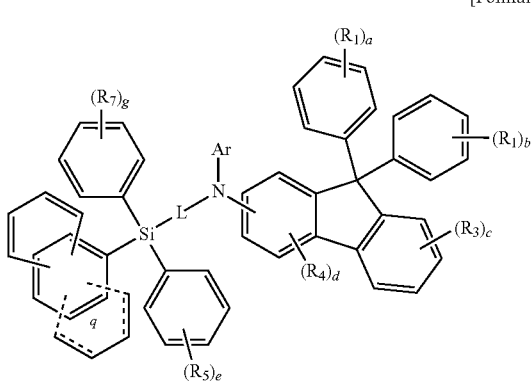

[Formula 5]

wherein in Formula 5, "q" is 0 or 1, and Ar, L, R1 to R5, R7, "a" to "e", and "g" are the same as for Formula 1.

13. The amine compound as claimed in claim 1, wherein Ar is an unsubstituted phenyl group, and L is a substituted or unsubstituted divalent biphenyl group.

14. An amine compound represented by Formula 1:

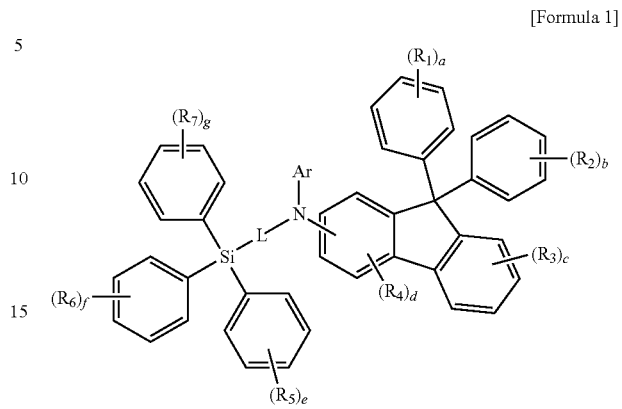

[Formula 1]

wherein in Formula 1, Ar is a substituted or unsubstituted aryl group having 6 to 30 carbon atoms for forming a ring, wherein when Ar is an aryl group having 6 carbon atoms for forming the ring substituted with a N-containing heteroaryl group, the heteroaryl group is a monocyclic, a bicyclic or a tricyclic heteroaryl group, L is a substituted or unsubstituted arylene group having 6 to 30 carbon atoms for forming a ring, or a substituted or unsubstituted heteroarylene group having 2 to 30 carbon atoms for forming a ring, R1, R2, and R4 to R7 are each independently a hydrogen atom, a deuterium atom, a halogen atom, an amino group, a substituted or unsubstituted silyl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, where R1 to R7 are separate or are combined with an adjacent group to form a ring, "a," "b," "e," "f," and "g" are each independently an integer of 1 to 5, "d" is an integer of 1 to 3, and "c" is 1, and R3 is a substituted or unsubstituted phenyl group.

15. The amine compound as claimed in claim 14, wherein Formula 1 is represented by the following Formula 6:

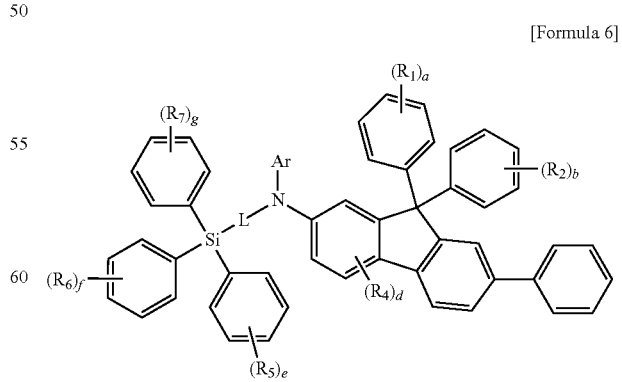

[Formula 6]

wherein in Formula 6, Ar, L, $R_1$, $R_2$, $R_4$ to $R_7$, "a," "b," and "d" to "g" are the same as for Formula 1.

16. The amine compound as claimed in claim 1, wherein the amine compound represented by Formula 1 is one selected from compounds represented in the following Compound Group 1:

[Compound Group1]

2

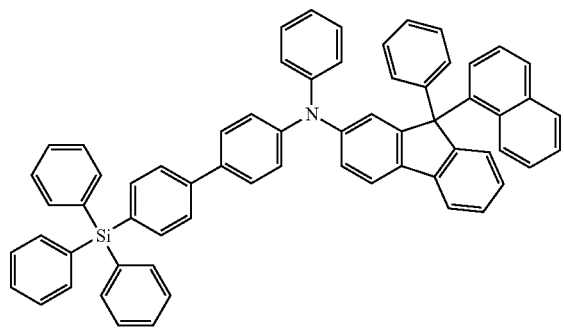

11

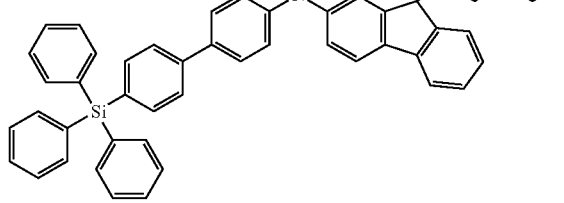

12

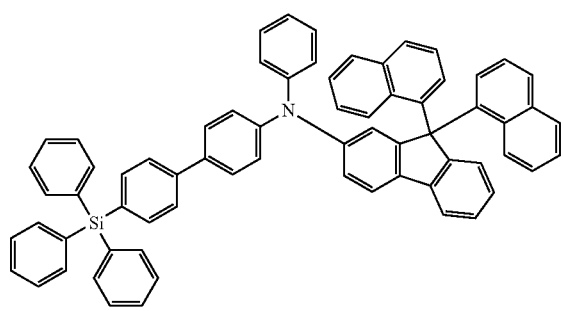

-continued

13

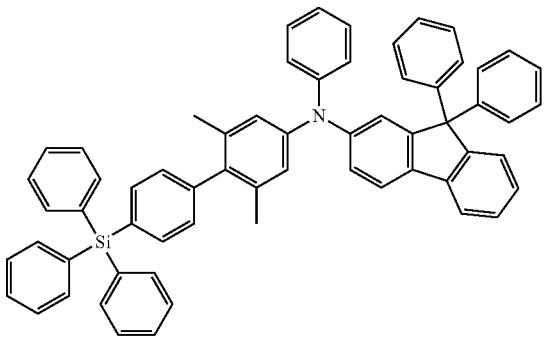

14

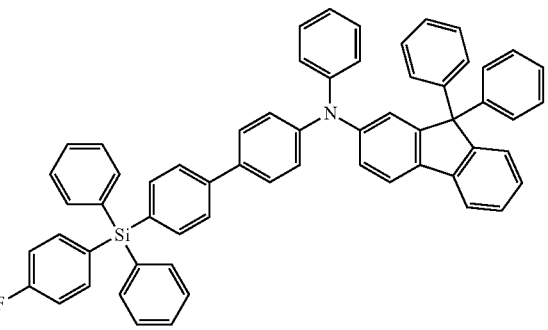

17. An organic electroluminescence device, comprising:

a first electrode;

a hole transport region provided on the first electrode;

an emission layer provided on the hole transport region;

an electron transport region provided on the emission layer; and a second electrode provided on the electron transport region, wherein the hole transport region includes the amine compound as claimed in claim 1.

18. The organic electroluminescence device as claimed in claim 17, wherein the hole transport region includes:

a hole injection layer disposed on the first electrode; and a hole transport layer disposed on the hole injection layer, wherein the amine compound represented by Formula 1 is included in the hole transport layer.

19. The amine compound as claimed in claim 12, wherein the amine compound represented by Formula 1 is one selected from Compounds 5 to 7:
5
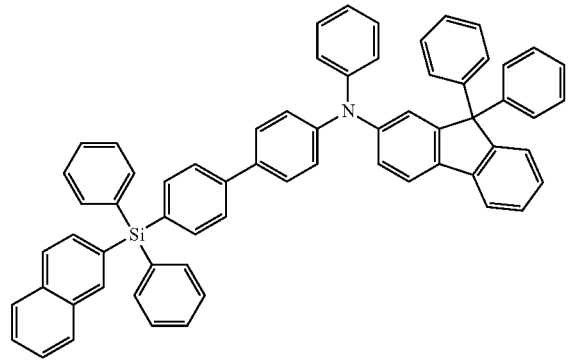
6
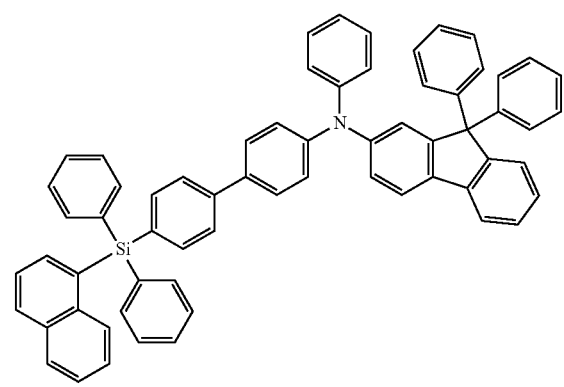
7
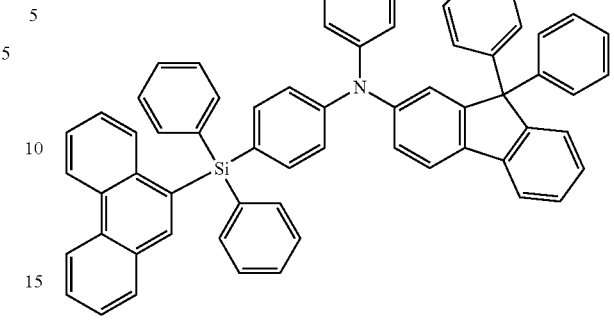
20. The amine compound as claimed in claim 14, wherein the amine compound represented by Formula 1 is Compound 4:
4
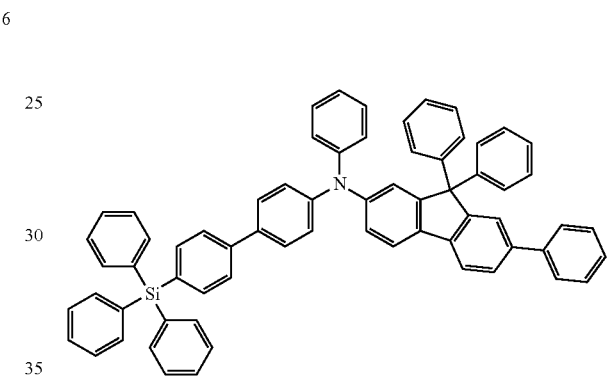
* * * * *

UNITED STATES PATENT AND TRADEMARK OFFICE
CERTIFICATE OF CORRECTION

| | |
|---|---|
| PATENT NO. | : 11,165,029 B2 |
| APPLICATION NO. | : 15/465845 |
| DATED | : November 2, 2021 |
| INVENTOR(S) | : Masatsugu Ueno et al. |

It is certified that error appears in the above-identified patent and that said Letters Patent is hereby corrected as shown below:

In the Claims

| | |
|---|---|
| Column 37, Line 22, Claim 12 | delete "30carbon" and insert -- 30 carbon -- |
| Column 37, Lines 26-27, Claim 12 | delete "30carbon" and insert -- 30 carbon -- |
| Column 37, Line 28, Claim 12 | delete "R1 to R7" and insert -- $R_1$ to $R_7$ -- |
| Column 37, approx. Line 31, Claim 12 | delete "20carbon" and insert -- 20 carbon -- |
| Column 37, approx. Line 35, Claim 12 | delete "R7" and insert -- $R_7$ -- |
| Column 37, Line 63, Claim 12 | delete "R1 to R5," and insert -- $R_1$ to $R_5$, -- |
| Column 37, Line 64, Claim 12 | delete "R7," and insert -- $R_7$, -- |
| Column 38, Line 22, Claim 14 | delete "6to 30carbon" and insert -- 6 to 30 carbon -- |
| Column 38, Lines 29-30, Claim 14 | delete "30carbon" and insert -- 30 carbon -- |

Signed and Sealed this
Sixth Day of December, 2022

Katherine Kelly Vidal
*Director of the United States Patent and Trademark Office*

CERTIFICATE OF CORRECTION (continued)
U.S. Pat. No. 11,165,029 B2

| | |
|---|---|
| Column 38, Line 31, Claim 14 | delete "R1, R2," and insert -- $R_1$, $R_2$, -- |
| Column 38, Line 31, Claim 14 | delete "R4 to R7" and insert -- $R_4$ to $R_7$ -- |
| Column 38, approx. Line 36, Claim 14 | delete "haying" and insert -- having -- |
| Column 38, approx. Line 37, Claim 14 | delete "haying" and insert -- having -- |
| Column 38, approx. Line 38, Claim 14 | delete "R1 to R7" and insert -- $R_1$ to $R_7$ -- |
| Column 38, Line 45, Claim 14 | delete "R3" and insert -- $R_3$ -- |